(12) United States Patent
Itoh

(10) Patent No.: US 8,698,526 B2
(45) Date of Patent: Apr. 15, 2014

(54) CLOCK SUPPLY APPARATUS

(71) Applicant: Canon Kabushiki Kaisha, Tokyo (JP)

(72) Inventor: Naotsugu Itoh, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/914,326

(22) Filed: Jun. 10, 2013

(65) Prior Publication Data

US 2013/0271189 A1    Oct. 17, 2013

Related U.S. Application Data

(63) Continuation of application No. 13/113,823, filed on May 23, 2011, now Pat. No. 8,487,672.

(30) Foreign Application Priority Data

May 26, 2010    (JP) .................................. 2010-120371

(51) Int. Cl.
    *H03L 7/00*    (2006.01)

(52) U.S. Cl.
    USPC .......................................................... 327/142

(58) Field of Classification Search
    USPC .......................................... 327/142, 143, 198
    See application file for complete search history.

(56) References Cited

U.S. PATENT DOCUMENTS

2005/0116754 A1*   6/2005   Ichikawa ..................... 327/198

FOREIGN PATENT DOCUMENTS

| JP | 2000-66760 A | 3/2000 |
|----|--------------|--------|
| JP | 2004-110718 A | 4/2004 |

* cited by examiner

*Primary Examiner* — Daniel Rojas
(74) *Attorney, Agent, or Firm* — Canon USA Inc. IP Division

(57) ABSTRACT

A clock supply apparatus for supplying clock signals to a plurality of circuit blocks includes a supply unit configured to supply, to reset the plurality of circuit blocks, a clock signal rising at timing different from one circuit block to another to each of the plurality of circuit blocks.

6 Claims, 33 Drawing Sheets

FIG.6A

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| C INPUT | | | x | | | | x | | | | x | | | | x | | | | | x | | | | | | | x | | | | x | x |
| Q CHANGE | | | | | | | x | | | | x | | | | x | | | | | x | | | | x | | | x | | | | x | x |
| CONSUMPTION CURRENT | L | L | M | L | L | L | M | L | L | L | M | L | L | L | M | L | L | L | L | H | M | M | H | H | H | L | H | L | L | L | M | H |

FIG.6B

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| C INPUT | | | x | | | | x | | | | x | | | | x | | | | x | | | | x | | | | x | x | x | x | | |
| Q CHANGE | | | x | | | | x | | | | x | | | | x | | | | x | | | x | | | | | x | x | x | x | | |
| CONSUMPTION CURRENT | L | L | H | H | L | L | H | M | L | L | H | L | L | L | M | L | L | L | H | L | M | H | M | M | L | L | H | H | H | H | L | L |

FIG.6C

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| C INPUT | | | x | | | | x | | | | x | | | | x | | | | x | | | | x | | | | x | | | | x | x |
| Q CHANGE | | | | | | | x | | | | x | | | | x | | | | x | | | | x | | | | x | | | | x | x |
| CONSUMPTION CURRENT | L | L | M | H | L | L | H | L | L | L | M | L | L | L | M | L | L | L | H | H | L | L | H | L | L | L | H | L | L | L | H | H |

FIG.8A

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| C INPUT | | | | x | | | | x | | | | x | | | | x | | | x | | | | | | x | | x | | x | | x | |
| Q CHANGE | | | | x | | | | x | | | | x | | | | | | | x | x | | | | | x | x | x | x | x | x | x | |
| CONSUMPTION CURRENT | L | L | L | H | L | L | L | M | L | L | L | M | L | L | L | M | L | L | H | H | L | L | L | L | H | H | H | H | H | M | H | L |

FIG.8B

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| C INPUT | | | | | x | | | | x | | | | x | | | | | | | | | | x | | x | | x | | x | | x | |
| Q CHANGE | | | | | x | | | | x | | | | x | | | | | | | | | | x | | x | | x | | x | | x | |
| CONSUMPTION CURRENT | L | L | L | L | M | L | L | L | M | L | L | L | M | L | L | L | L | L | L | L | L | L | H | L | H | L | M | L | H | L | M | L |

FIG.8C

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| C INPUT | | | | | | x | | | | x | | | | x | | | | x | x | | | x | x | | x | x | x | | x | x | x | |
| Q CHANGE | | | | | | x | | | | x | | | | x | | | | x | x | | | x | x | | x | x | x | | x | x | x | |
| CONSUMPTION CURRENT | L | L | L | L | L | H | L | L | L | M | L | L | L | M | L | L | L | H | H | L | L | H | H | L | H | H | H | L | L | H | H | L |

FIG.12

|  | H | M | L |
|---|---|---|---|
| CONSUMPTION CURRENT | 8 [pA] | 5 [pA] | 2 [pA] |

FIG.13A

|   | NUMBER OF FLIP-FLOPS | CONSUMPTION CURRENT |
|---|---|---|
| H | 13 | 104 [pA] |
| M | 18 | 90 [pA] |
| L | 25 | 50 [pA] |
| TOTAL | 56 | 244 [pA] |

FIG.13B

|   | NUMBER OF FLIP-FLOPS | CONSUMPTION CURRENT |
|---|---|---|
| H | 6 | 48 [pA] |
| M | 8 | 40 [pA] |
| L | 42 | 84 [pA] |
| TOTAL | 56 | 172 [pA] |

FIG.13C

|   | NUMBER OF FLIP-FLOPS | CONSUMPTION CURRENT |
|---|---|---|
| H | 0 | 0 [pA] |
| M | 14 | 70 [pA] |
| L | 42 | 84 [pA] |
| TOTAL | 56 | 154 [pA] |

FIG.20

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| C INPUT | | | x | | | | x | | | | x | | | | x | | | | x | x | x | x | x | x | x | | x | | | | x | x |
| Q CHANGE | | | | | | | | | | | | | | | x | | | | x | | | | x | x | x | | x | | | | | x |
| CONSUMPTION CURRENT | L | L | M | L | L | L | M | L | L | L | M | L | L | L | M | L | L | L | H | H | M | M | H | H | H | L | H | L | L | L | M | H |

FIG.24

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| C INPUT | | | × | | | | × | | | | × | | | | × | | | | | × | × | × | × | × | × | | × | | | | × | × |
| Q CHANGE | | | | | | | | | | | | | | | × | | | | | × | × | | × | × | × | | × | | | | | × |
| CONSUMPTION CURRENT | L | L | M | L | L | L | M | L | L | L | M | L | L | L | M | L | L | L | L | H | M | M | H | H | H | L | H | L | L | L | M | H |

FIG.28A

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| C INPUT | | | x | x | x | x | x | x | x | x | x | x | x | x | x | x | | | x | x | x | x | x | x | x | x | x | | | | x | x |
| Q CHANGE | | | | | | | | | | | | | | | | | | | | | | | x | x | x | | x | | | | | x |
| CONSUMPTION CURRENT | L | L | M | M | M | M | M | M | M | M | M | M | M | M | M | M | L | L | L | H | M | M | M | H | H | L | H | L | L | L | M | H |

FIG.28B

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| C INPUT | | | x | x | x | x | x | x | x | x | x | x | x | x | x | x | | | x | x | | x | | x | | | x | x | x | x | | |
| Q CHANGE | | | | x | | | | | | | | | | | | | | | | | | | x | | | | | | | | | |
| CONSUMPTION CURRENT | L | L | H | H | M | M | M | M | M | M | M | M | M | M | M | M | L | L | H | H | M | H | M | H | L | L | H | H | H | H | L | L |

FIG.28C

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| C INPUT | | | x | x | x | x | x | x | x | x | x | x | x | x | x | x | | | x | x | x | x | x | x | x | x | x | x | | | x | x |
| Q CHANGE | | | | x | | | | | | | | | | | | | | | | | | | x | | | | | | | | x | x |
| CONSUMPTION CURRENT | L | L | M | H | M | M | M | M | M | M | M | M | M | M | M | M | L | L | H | H | L | L | H | H | L | L | H | H | L | L | H | H |

FIG.31A

|  | NUMBER OF FLIP-FLOPS | CONSUMPTION CURRENT |
|---|---|---|
| H | 6 | 46 [pA] |
| M | 50 | 250 [pA] |
| L | 0 | 0 [pA] |
| TOTAL | 56 | 298 [pA] |

FIG.31B

|  | NUMBER OF FLIP-FLOPS | CONSUMPTION CURRENT |
|---|---|---|
| H | 0 | 0 [pA] |
| M | 56 | 280 [pA] |
| L | 0 | 0 [pA] |
| TOTAL | 56 | 280 [pA] | ns # CLOCK SUPPLY APPARATUS

CROSS REFERENCE TO RELATED APPLICATIONS

The present application is a Continuation of U.S. patent application Ser. No. 13/113,823 filed May 23, 2011, which claims priority from Japanese Patent Application No. 2010-120371 filed May 26, 2010, the entire contents of each of which are hereby incorporated by reference.

BACKGROUND OF THE INVENTION

1. Field of the Invention

The present invention relates to a clock supply apparatus that supplies a clock signal to a circuit block.

2. Description of the Related Art

Power supply and heat designing/manufacturing of a semiconductor integrated circuit device (hereinafter, LSI) and a system on which the LSI is mounted must be coordinated with maximum power consumption of the LSI and the system. Power supply designing/manufacturing of the LSI must also be coordinated with maximum current consumption of the LSI. When power consumption or current consumption is large, a difficulty level of designing/manufacturing and a price are high. Thus, there has been proposed a technology for reducing power consumption and current consumption of the LSI.

The power consumption of the LSI that includes a logical circuit operated in synchronization with a clock signal, except for a static part based on a leakage current, is caused by a dynamic operation based on a clock synchronization operation. The dynamic power consumption can be considered based on an operation of a flip-flop that changes its state in synchronization with a clock signal.

It is the following two operations when an active edge of an input clock signal for operating the flip-flop is input that dynamically consumes power during the operation of the flip-flop. One is a latch operation for storing input data inside, and the other is a toggle operation for changing data output during the latch operation. Power consumed during the latch operation includes not only power consumed by the flip-flop itself but also power consumed by a buffer to transmit the input clock signal. Power consumed during the toggle operation includes not only power consumed by the flop-flop itself but also power consumed by the buffer to transmit an output data signal.

Under these circumstances, as a technology for reducing power consumption and current consumption of the logical circuit, there has been proposed a clock gating technology based on enabling, which stops a clock for driving the flip-flop while enabling control of the flip-flop in the circuit is inactive. This technology reduces power consumption by control not to perform any unnecessary operation logically. Each flip-flop performs a latch operation only when necessary, and none of the flip-flops always performs a latch operation according to an active edge input of the input clock signal. Thus, current consumption can be reduced as well.

As a technology for reducing power consumption during a resetting operation of the logical circuit, there has been proposed a technology for setting a clock frequency lower during the resetting operation than that during a normal operation (discussed in Japanese Patent Application Laid-Open No. 2000-66760). This technology reduces total power consumption and power consumption per unit time by decreasing the number of times of latching during a sufficiently long resetting period to a necessary minimum.

As a technology for reducing current consumption during the resetting operation of the logical circuit, there has been proposed a technology for preventing, by controlling supplying of independent clocks to a plurality of circuit blocks during the resetting operation, overlapping of resetting periods between the clock circuits (discussed in Japanese Patent Application Laid-Open No. 2004-110718). This technology reduces instantaneous current consumption per clock cycle by performing control not to simultaneously supply clocks to all the circuit blocks during the resetting period.

However, the enabling control of the flip-flop is always active logically during the resetting operation, and hence the clock cannot be stopped by the clock gating technology based on the enabling, disabling reduction of power consumption and current consumption. As a result, depending on contents of the logical circuit, power consumption and current consumption may be higher during the resetting operation than those during the normal operation. In such a case, even when the power consumption and the current consumption can be lowered during the normal operation, designing/manufacturing of a power supply and heat must be coordinated not with the power consumption and the current consumption during the normal operation but with maximum power consumption and maximum current consumption during the resetting operation.

According to the technology for setting the clock frequency lower during the resetting operation than that during the normal operation, the reduction in total number of times of latching during the resetting period results in reduction of power consumption. However, the number of flip-flops per clock, which perform latch operations, cannot be decreased. In other words, all the flip-flops still operate with respect to the input of the active clock edge, and hence instantaneous current consumption per clock cannot be reduced. As a result, depending on contents of the logical circuit, current consumption may be higher during the resetting operation than that during the normal operation. In such a case, even when the current consumption during the normal operation can be reduced by the clock gating technology based on the enabling, designing/manufacturing of a power supply must be coordinated not with the current consumption during the normal operation but with maximum current consumption during the resetting operation.

According to the technology for preventing overlapping of the resetting periods between the circuit blocks by controlling supplying of the independent clocks to the plurality of circuit blocks during the resetting operation, current consumption can be reduced by performing control to prevent overlapping of all the resetting periods of the circuit blocks. However, when there is a logical connection among the circuit blocks, no overlapping of all the resetting periods may disable complete resetting, because of the following mechanism.

A flip-flop with no reset terminal can reset clock synchronization by arranging a logical circuit so that input data can be fixed to low (L) or high (H) while a reset signal is active. Depending on a design of a logical circuit, a flip-flop where input data is fixed to neither L nor H even while the reset signal is active may be included. Such a flip-flop can be reset only when an active clock edge is input after all the flip-flops logically connected to an input data pin have been reset. Thus, when the flip-flops logically connected to the input data pin of the flip-flop include a flip-flop of another circuit block yet to be reset, this flip-flop cannot be reset. In other words, when the flip-flops included in the plurality of circuit blocks are connected to one another, independent setting of the resetting periods of all the circuit blocks may lead to incomplete resetting.

SUMMARY OF THE INVENTION

The present invention is directed to a clock supply apparatus capable of appropriately resetting a plurality of circuit blocks as a whole while reducing peak current consumption of the plurality of circuit blocks as a whole.

According to an aspect of the present invention, a clock supply apparatus for supplying clock signals to a plurality of circuit blocks includes a supply unit configured to supply, to reset the plurality of circuit blocks, a clock signal rising at timing different from one circuit block to another to each of the plurality of circuit blocks.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 6A to 6C illustrate operations and magnitudes of consumption currents of the flip-flops in the timing charts of FIGS. 5A to 5F.

FIGS. 8A to 8C illustrate operations and magnitudes of consumption currents of the flip-flops in the timing charts of FIGS. 7A to 7F.

FIG. 12 illustrates a relationship between consumption current values "H", "M", and "L" illustrated in FIGS. 6A to 6C, FIGS. 8A to 8C, and FIGS. 9 to 11 and actual current values.

FIGS. 13A to 13C illustrate consumption current values in a state during the normal operation, in a state during the initialization in the resetting period, and in the steady state after the initialization illustrated in FIGS. 9 to 11.

FIG. 20 illustrates the operation of the flip-flop and a magnitude of a consumption current in the timing chart of FIG. 19B.

FIG. 24 illustrates the operation of the flip-flop and a magnitude of a consumption current in the timing chart of FIG. 23B.

FIGS. 28A to 28C illustrate operations and magnitudes of consumption currents of the flip-flops in the timing charts of FIGS. 27A to 27F.

FIGS. 31A and 31B illustrate consumption current values in a state during the normal operation, in a state during the initialization in the resetting period, and in the steady state after the initialization illustrated in FIGS. 29 and 30.

DESCRIPTION OF THE EMBODIMENTS

Various exemplary embodiments, features, and aspects of the invention will be described in detail below with reference to the drawings.

Figure 1:
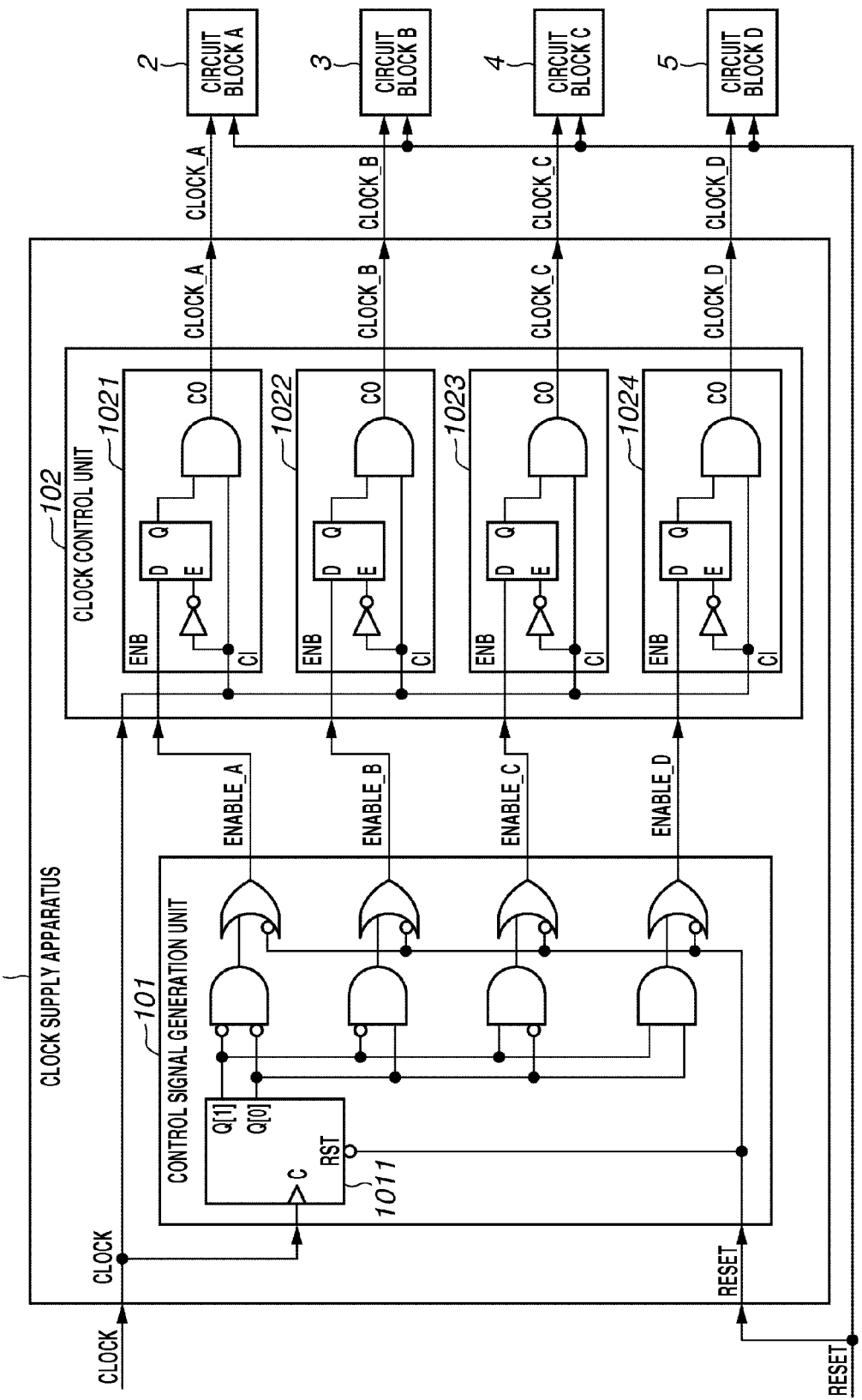
FIG. 1 is a block diagram illustrating an external connection configuration and an internal configuration of a clock supply apparatus according to a first exemplary embodiment of the present invention.

FIG. 1 is a block diagram illustrating an external connection configuration and an internal configuration of a clock supply apparatus according to a first exemplary embodiment of the present invention. FIG. 1 specifically illustrates the clock supply apparatus 1, a circuit block A 2, a circuit block B 3, a circuit block C 4, and a circuit block D 5. The clock supply apparatus 1 supplies clocks to the circuit block A 2, the circuit block B 3, the circuit block C 4, and the circuit block D 5.

The clock supply circuit 1 includes a control signal generation unit 101 and a clock control unit 102. The control signal generation unit 101 includes a 2-bit counter 1011, and the clock control unit 102 includes clock gating cells 1021, 1022, 1023, and 1024.

The clock supply apparatus 1 is connected to a clock oscillator (not illustrated), a reset generator (not illustrated), the circuit block A 2, the circuit block B 3, the circuit block C 4, and the circuit block D 5. The clock supply apparatus 1 operates in synchronization with a clock signal CLOCK output from the clock oscillator (not illustrated). The clock supply apparatus 1 receives a reset signal RESET output from the reset generator (not illustrated) in synchronization with the clock signal, and operates based on recognition of a normal operation period when the reset signal is at an L level, and a resetting period when the reset signal is at an H level. The clock supply apparatus 1 outputs a clock signal CLOCK_A to the circuit block A 2, a clock signal CLOCK_B to the circuit block B 3, a clock signal CLOCK_C to the circuit block C 4, and a clock signal CLOCK_D to the circuit block D 5.

The circuit blocks A 2, B 3, C 4, and D 5 are connected to the clock supply apparatus 1 and the reset generator (not illustrated). The circuit block A 2 operates in synchronization with the clock signal CLOCK_A output from the clock supply apparatus 1. The circuit block B 3 operates in synchronization with the clock signal CLOCK_B output from the clock supply apparatus 1. The circuit block C 4 operates in synchronization with the clock signal CLOCK_C output from the clock supply apparatus 1. The circuit block D 5 operates in synchronization with the clock signal CLOCK_D output from the clock supply apparatus 1.

The circuit blocks A 2, B 3, C 4, and D 5 receive the reset signal RESET output from the reset generator (not illustrated), perform normal operations while the reset signal is at the L level, and resetting operations while the reset signal is at the H level, in other words, initialize internal flip-flops.

The control signal generation unit 101 is connected to a signal line of the clock signal CLOCK, a signal line of the reset signal RESET, and the clock control unit 102, and operates in synchronization with the clock signal. The control signal generation unit 101 receives the reset signal, and operates based on recognition of a normal operation period when the reset signal is at the L level, and a resetting period when the reset signal is at the H level. The control signal generation unit 101 transmits a plurality of control signals ENABLE_A, ENABLE_B, ENABLE_C, and ENABLE_D to the clock control unit 102.

The clock control unit 102 is connected to the signal line of the clock signal CLOCK, the control signal generation unit 101, and signal lines of the output clock signals CLOCK_A, CLOCK_B, CLOCK_C, and CLOCK_D. The clock control unit 102 operates by using the clock signal. The clock control unit 102 receives the plurality of control signals ENABLE_A, ENABLE_B, ENABLE_C, and ENABLE_D output from the control signal generation unit 101. The clock control unit 102 outputs the output clock signals CLOCK_A, CLOCK_B, CLOCK_C, and CLOCK_D according to the plurality of control signals ENABLE_A, ENABLE_B, ENABLE_C, and ENABLE_D.

The 2-bit counter 1011 is connected to signal lines of the output signals ENABLE_A, ENABLE_B, ENABLE_C, and ENABLE_D via the clock signal CLOCK, the reset signal RESET, and a combinational circuit. The 2-bit counter 1011 performs a counting operation in synchronization with the clock signal, and an initialization operation asynchronously with the clock signal.

The 2-bit counter 1011 receives the reset signal, and initializes a counter output value Q[1:0] to "0" while the reset signal RESET is at the L level. The 2-bit counter 1011 performs counting in synchronization with the clock signal while the reset signal RESET is at the H level (during the resetting operation), and increments the counter output Q[1:0] by 1 for each clock. The 2-bit counter 1011 has a 2-bit counter output value Q[1:0], and the counter output value Q[1:0] is repeated among "0", "1", "2", and "3" during the normal operation. In this case, the counter output value is expressed by converting a binary number interpreted not with a H/L level but with H and L respectively set to "1" and "0" into a decimal number.

The output signal ENABLE_A is at the H level when the reset signal is at the L level or when the counter output value Q[1:0] is "0", and at the L level in other cases. The output signal ENABLE_B is at the H level when the reset signal is at the L level or when the counter output value Q[1:0] is "1", and at the L level in other cases. The output signal ENABLE_C is at the H level when the reset signal is at the L level or when the counter output value Q[1:0] is "2", and at the L level in other cases. The output signal ENABLE_D is at the H level when the reset signal is at the L level or when the counter output value Q[1:0] is "3", and at the L level in other cases. In other words, during the resetting operation, the control signal generation unit 101 generates a plurality of control signals (ENABLE_A to D) that become active during periods (different periods) corresponding to the different count values (0, 1, 2, and 3) indicated by the counter 1011.

The clock gating cell 1021 is connected to the signal lines of the clock signal CLOCK, the input signal ENABLE_A, and the output clock signal CLOCK_A, and CI, ENB, and CO terminals, and thins pulses contained in the clock signal. The clock gating cell 1022 is connected to the signal lines of the clock signal CLOCK, the input signal ENABLE_B, and the output clock signal CLOCK_B, and the CI, ENB, and CO terminals, and thins pulses contained in the clock signal. The clock gating cell 1023 is connected to the signal lines of the clock signal CLOCK, the input signal ENABLE_C, and the output clock signal CLOCK_C, and CI, ENB, and CO terminals, and thins pulses contained in the clock signal. The clock gating cell 1024 is connected to the signal lines of the clock signal CLOCK, the input signal ENABLE_D, and the output clock signal CLOCK_D, and the CI, ENB, and CO terminals, and thins pulses contained in the clock signal.

The clock gating cell 1021 generates and outputs an output clock CO in which clock pulses of an input clock are thinned by subjecting the input clock CI to gating at an illustrated AND gate. An output signal Q of an illustrated latch for determining whether to perform gating is generated from an input signal ENB. The output signal Q of the latch changes only while the input clock CI is at the L level, and hence presence or absence of a gating operation at the AND gate is not changed in the midway of the clock pulses of the input clock. The clock gating cells 1022, 1023, and 1024 are similar to the clock gating cell 1021. In other words, during the resetting operation, the clock control unit 102 generates a plurality of clock signals CLOCK_A to D having different active edge phases by thinning the clock pulses of the inactive period of the ENABLE_A to D from the clock signal.

Figure 2A:
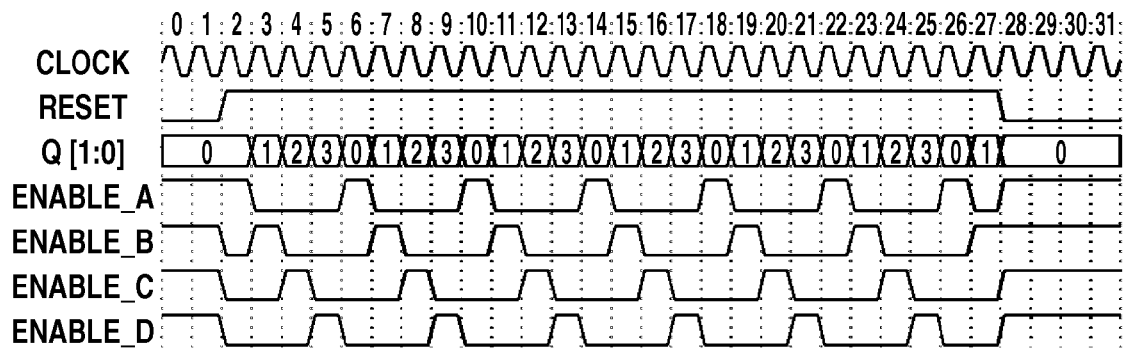
FIGS. 2A to 2C are timing charts illustrating operations of a control signal generation unit, a clock gating cell, and the clock supply apparatus according to the first exemplary embodiment.
Figure 2B:
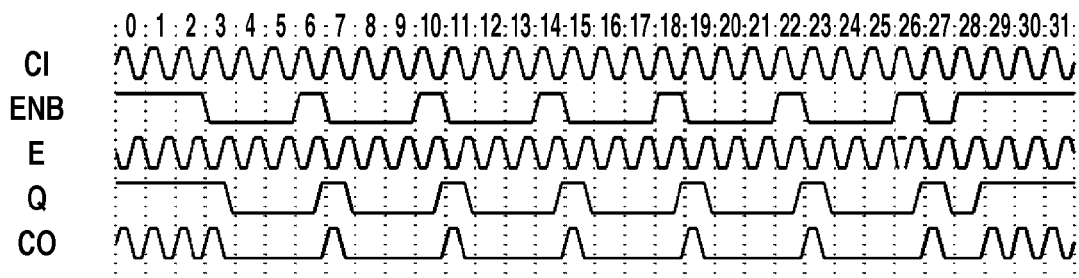
Figure 2C:
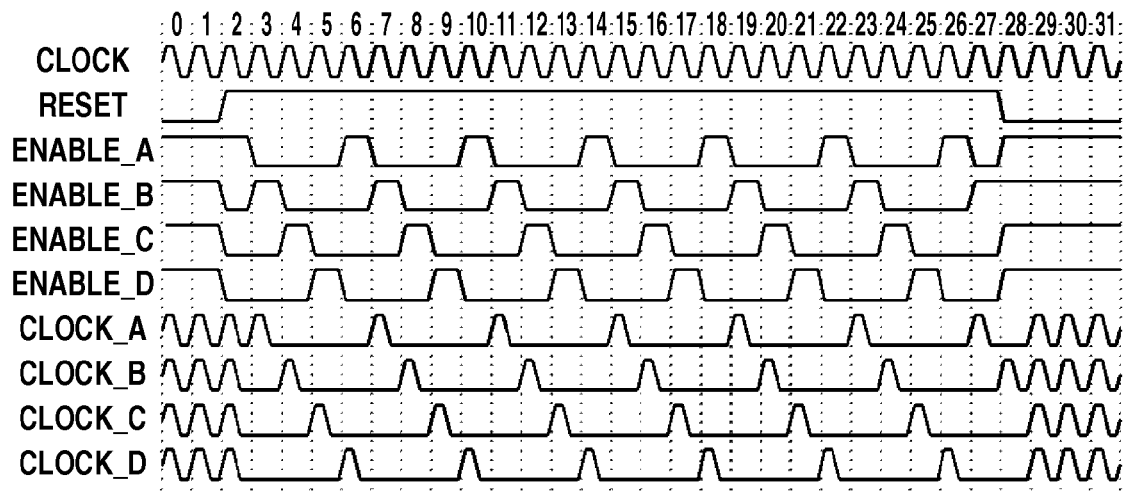

FIGS. 2A to 2C are timing charts illustrating operations of the control signal generation unit 101, the clock gating cell 1021, and the clock supply apparatus 1 according to the first exemplary embodiment. FIG. 2A is the timing chart illustrating the operation of the control signal generation unit 101 according to the first exemplary embodiment. During the resetting period, in other words, while the reset signal RESET is at the H level, the counter output Q[1:0] changes for each clock cycle due to a counting operation. As described above, the control signal generation unit 101 operates by switching the output signals ENABLE_A, ENABLE_B, ENABLE_C, and ENABLE_D between the H level and the L level according to the counter output value during the resetting period. The output signals ENABLE_A, ENABLE_B, ENABLE_C, and ENABLE_D are fixed, as described above, at the H levels during the normal operation period, in other words, while the reset signal RESET is at the L level. During the resetting period, in other words, while the reset signal RESET is at the H level, the control signal generation unit 101 operates so as to prevent overlapping of clock cycles where the output signals ENABLE_A, ENABLE_B, ENABLE_C, and ENABLE_D are at the H levels.

FIG. 2B is the timing chart illustrating the operation of the clock gating cell 1021 according to the first exemplary embodiment. The input signal ENB is latched while the input clock CI is at the L level (i.e., while a reversal signal E of the input clock is at the H level) to be reflected in an output signal Q of the latch. The output clock CO becomes a logical product of the input clock CI and the output signal Q of the latch where clock pulses are thinned.

FIG. 2C is the timing chart illustrating the operation of the clock supply apparatus 1 according to the first exemplary embodiment. While the reset signal is at the H level, as described above, the plurality of control signals ENABLE_A, ENABLE_B, ENABLE_C, and ENABLE_D are generated not to be at H levels simultaneously. The output clock signals CLOCK_A, CLOCK_B, CLOCK_C, and CLOCK_D are signals where clock signals CLOCK have been thinned according to the plurality of control signals. During the resetting operation, the output clock signals CLOCK_A, CLOCK_B, CLOCK_C, and CLOCK_D have different active edge phases where clock cycles set at H levels do not overlap one another. In other words, the output clock signals CLOCK_A, CLOCK_B, CLOCK_C, and CLOCK_D rise at different timings.

While the reset signal is at the L level, as described above, the plurality of control signals ENABLE_A to D are simultaneously set to H levels, and the output clock signals CLOCK_A to D become clock signals CLOCK themselves. Thus, during the normal operation, the output clock signals CLOCK_A to D have predetermined active edge phases.

The circuit block A 2, the circuit block B 3, the circuit block C 4, and the circuit block D 5 are designed to refer to the reset signal RESET in synchronization with the clock signals. Thus, the resetting period of these circuit blocks is from a cycle 3 to a cycle 28. In other words, during the normal operations of the circuit blocks A 2 to D 5, the clock supply apparatus 1 supplies clock signals having predetermined active edge phases to the circuit blocks A 2 to D5 (first clock supplying). During the resetting operations of the circuit blocks A 2 to D 5, the clock supply apparatus 1 supplies clock signals having different active edge phases to the circuit blocks A 2 to D 5 (second clock supplying).

Figure 3:
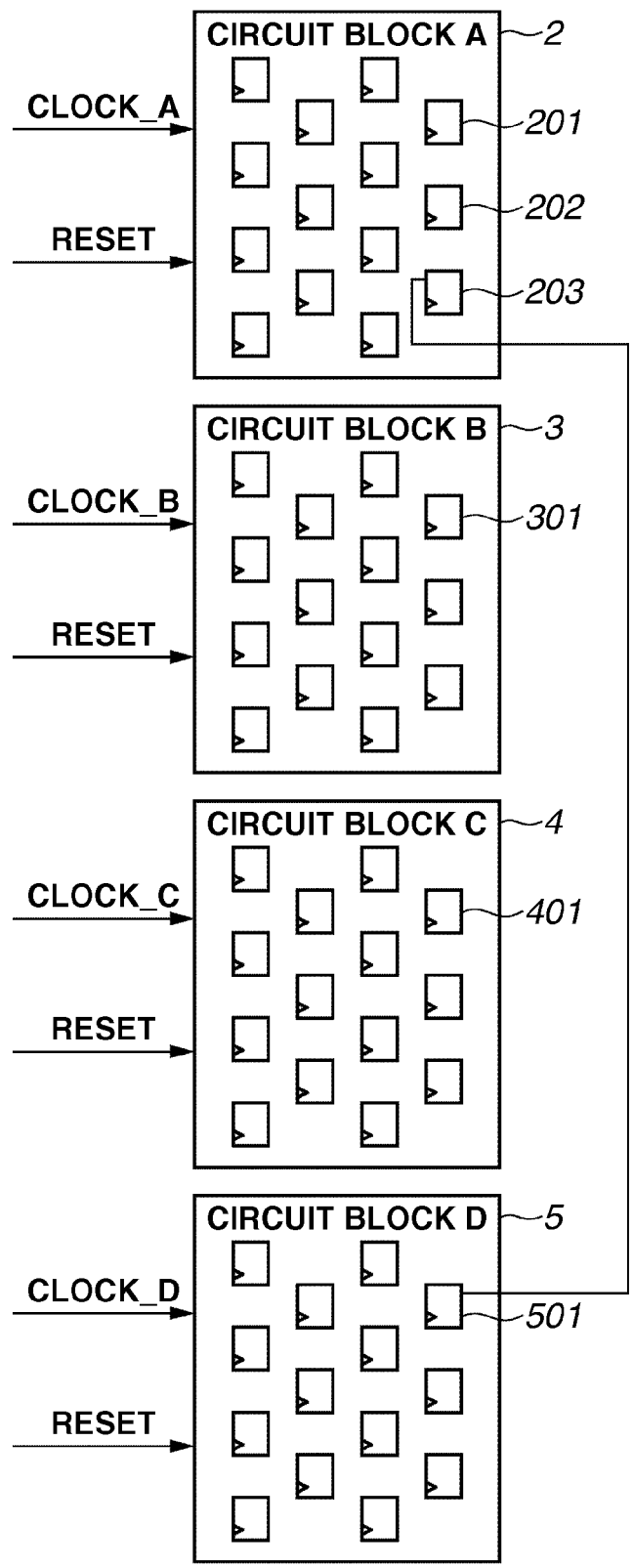
FIG. 3 is a block diagram illustrating only flip-flops included in a circuit block A, a circuit block B, a circuit block C, and a circuit block D illustrated in FIG. 1.

FIG. 3 is a block diagram illustrating only flip-flops 201, 202, 203, 301, 401, and 501 included in the circuit block A 2, the circuit block B 3, the circuit block C 4, and the circuit block D5 illustrated in FIG. 1. Those illustrated similarly in shape to these flip-flops, including those having no reference numerals, are all flip-flops. For description, only some of the flip-flops have reference numerals. Concerning terminal connections of the flip-flops, only a connection between the flip-flop 203 and the flip-flop 501 is illustrated, while others are omitted.

In the circuit block A 2, as described above, the flip-flops are initialized while the reset signal RESET is at the H level. However, initializing procedures are different among the flip-flop 201, the flip-flop 202, and the flip-flop 203, which are described in detail below. A data signal output from a data output terminal of the flip-flop 501 of the circuit block D 5 is connected to a data input terminal of the flip-flop 203. As described above, the circuit block A 2 normally operates in synchronization with the clock signal while the reset signal RESET is at the L level.

As described above, in the circuit block B 3, similarly, the flip-flops are initialized while the reset signal RESET is at the H level. The circuit block B 3 normally operates in synchronization with the clock signal while the reset signal RESET is at the L level. As described above, in the circuit block C 4, similarly, the flip-flops are initialized while the reset signal RESET is at the H level. The circuit block C 4 normally operates in synchronization with the clock signal while the reset signal RESET is at the L level.

As described above, in the circuit block D 5, similarly, the flip-flops are initialized while the reset signal RESET is at the H level. The circuit block D 5 normally operates in synchronization with the clock signal while the reset signal RESET is at the L level. The data signal output from the data output terminal of the flip-flop 501 of the circuit block D 5 is connected to the data input terminal of the flip-flop 203 of the circuit block A 2.

Figure 4A:
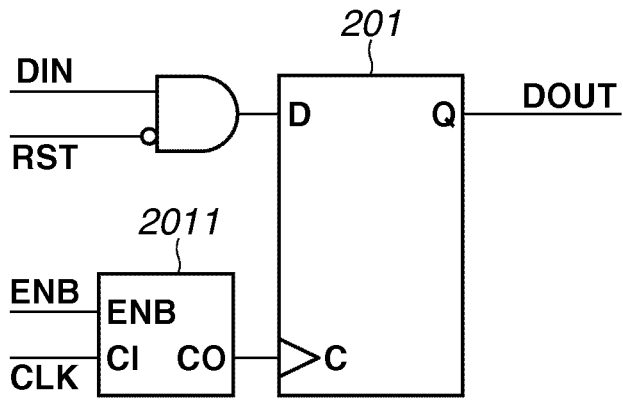
FIGS. 4A to 4C are block diagrams illustrating connection configurations of the flip-flops illustrated in FIG. 3.
Figure 4B:
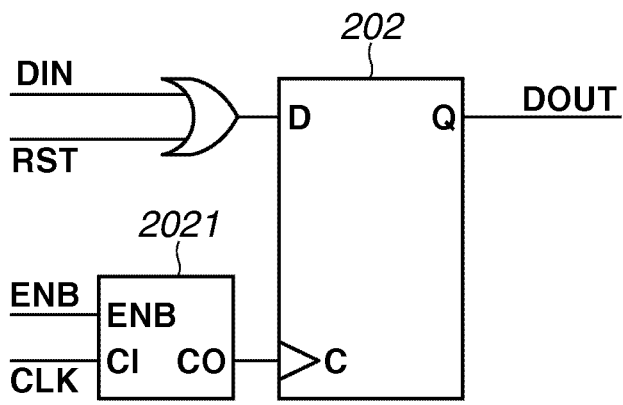
Figure 4C:
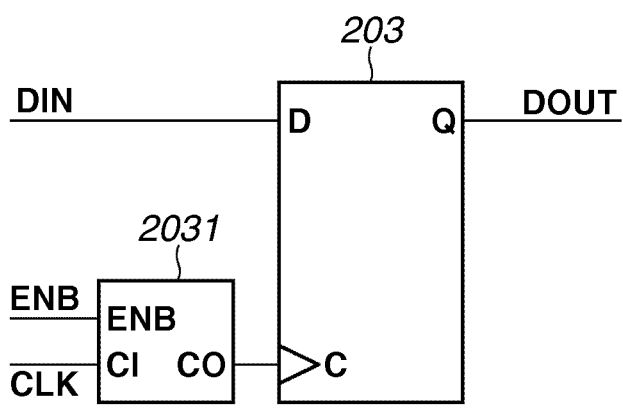

FIGS. 4A to 4C are block diagrams illustrating connection configurations of the flip-flops 201, 202, and 203 illustrated in FIG. 3. FIG. 4A is the block diagram illustrating the connection configuration of the flip-flop 201. In FIG. 4A, a clock gating cell 2011 is similar to the clock gating cell 1021.

The "clock gating technology based on enabling" is applied to the flip-flop 201. A clock where a clock signal CLK has been subjected to clock gating based on a control signal ENB is input to a clock terminal C of the flop-flop 201. A logical product of a data signal DIN and a reversal signal of a reset signal RST is input to a data input terminal D of the flip-flop 201. The flip-flop 201 stores a value input to the data input terminal D at rising edge timing of the clock input to the clock terminal C, and outputs the stored value as a data signal DOUT from a data output terminal Q. During the resetting period, in other words, while the reset signal RST is at the H level, a value of the L level is input to the data input terminal D, and hence the value stored in the flip-flip 201 is initialized to an L level in synchronization with a rising edge of the clock signal input to the clock terminal C. The flip-flop directly initialized to the L level by the value of the reset signal in synchronization with the rising edge of the clock signal, as in the case of the flip-flop 201, is referred to as a flip-flop with a synchronous reset.

FIG. 4B is the block diagram illustrating the connection configuration of the flip-flop 202. In FIG. 4B, a clock gating cell 2021 is similar to the clock gating cell 1021.

The "clock gating technology based on enabling" is applied to the flip-flop 202. A clock where a clock signal CLK has been subjected to clock gating based on a control signal ENB is input to a clock terminal C of the flop-flop 202. A logical product of a data signal DIN and a reset signal RST is input to a data input terminal D of the flip-flop 202. The flip-flop 202 stores a value input to the data input terminal D at rising edge timing of the clock input to the clock terminal C, and outputs the stored value as a data signal DOUT from a data output terminal Q. During the resetting period, in other words, while the reset signal RST is at the H level, a value of the H level is input to the data input terminal D, and hence the value stored in the flip-flip 202 is initialized to an H level in synchronization with a rising edge of the clock signal input to the clock terminal C. The flip-flop directly initialized to the H level by the value of the reset signal in synchronization with the rising edge of the clock signal, as in the case of the flip-flop 202, is referred to as a flip-flop with a synchronous set.

FIG. 4C is the block diagram illustrating the connection configuration of the flip-flop 203. In FIG. 4C, a clock gating cell 2031 is similar to the clock gating cell 1021.

The "clock gating technology based on enabling" is applied to the flip-flop 203. A clock where a clock signal CLK has been subjected to clock gating based on a control signal ENB is input to a clock terminal C of the flop-flop 203. A data signal DIN is input to a data input terminal D of the flip-flop 203. The flip-flop 203 stores a value input to the data input terminal D at rising edge timing of the clock input to the clock terminal C, and outputs the stored value as a data signal DOUT from a data output terminal Q. During the resetting period, in other words, while the reset signal RST is at the H level, a value input to the data input terminal D is not directly fixed, and hence the value is fixed as an initialization value after all the other flip-flops related to generation of the value of the input data DIN are initialized. At subsequent timing, the value stored in the flip-flop 203 is initialized in synchronization with a rising edge of the clock signal input to the clock terminal C. The flip-flop not directly initialized by the value of the reset signal, as in the case of the flip-flop 203, is referred to as a flip-flop with no reset. Timing to initialize the flip-flop with no reset is when the rising edge of the input clock is input after all the previous flip-flops have been initialized. The previous flip-flops mean the other flip-flops (corresponding to the flip-flop 501 of the circuit block D 5 in the present exemplary embodiment) related to determination of the value of the input data DIN.

FIGS. 5A to 5F are timing charts illustrating operations of the circuits and the flip-flops 201, 202, and 203 illustrated in FIGS. 4A to 4C based on clocks generated by the clock supply apparatus 1 according to the first exemplary embodiment.

Figure 5A:
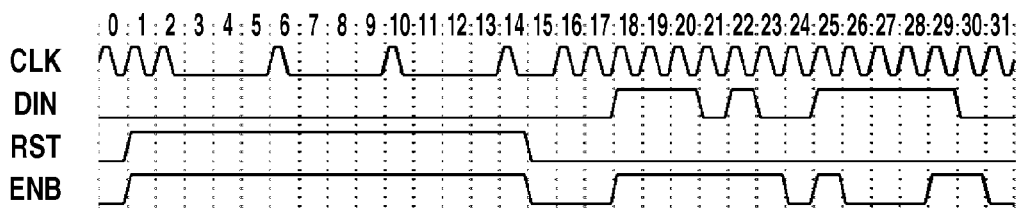
FIGS. 5A to 5F are timing charts illustrating operations of the circuits and the flip-flops illustrated in FIGS. 4A to 4C based on clocks generated by the clock supply apparatus according to the first exemplary embodiment.

FIG. 5A is the timing chart illustrating the operation of the circuit illustrated in FIG. 4A. The control signal ENB for performing enabling control by the "clock gating technology based on enabling" is at an H level at timing when the flip-flop 201 is set in a state to perform a latching operation. The state to perform the latching operation is determined based on logical design contents, and the H-level period of the reset signal is included in the state to perform the latching operation. In the state to perform the latching operation, the control signal ENB takes a value of the H level.

The clock signal CLK becomes, as described above, a clock where clock pulses have been thinned from the clock signal CLOCK during the resetting period. Initialization of the flip-flop 201 by the reset signal is performed in synchronization with the clock as described above. Thus, the resetting period is a period from a cycle 2 to a cycle 15 where the H-level period of the reset signal is shifted backward by one clock cycle.

Figure 5B:
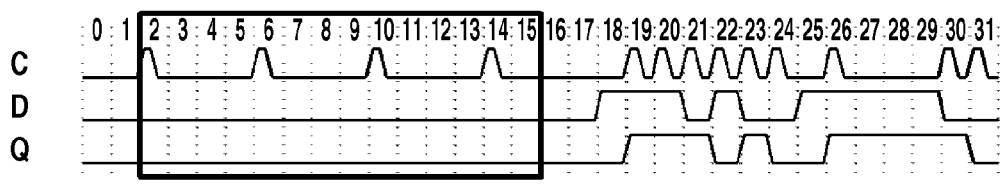

FIG. 5B is the timing chart illustrating the operation of the flip-flop 201 in the timing chart illustrated in FIG. 5A. A clock input to the clock terminal C of the flip-flop 201 is, as described above, a clock subjected to clock gating at the clock gating cell 2011 according to the control signal ENB based on the clock signal CLK input to the clock gating cell 2011. Thus, a clock input to the clock terminal C during the resetting period where the control signal ENB is always at the H level is the clock signal CLK. A clock input to the clock terminal C during the normal operation where the control signal ENB changes is a clock where clock pulses have been thinned from the clock signal CLK as illustrated. The resetting period is a period from a cycle 2 to a cycle 15 enclosed by a heavy-line frame illustrated in FIG. 5B. The flip-flop is initialized at the cycle 2. However, a stored value is not changed.

Figure 5C:
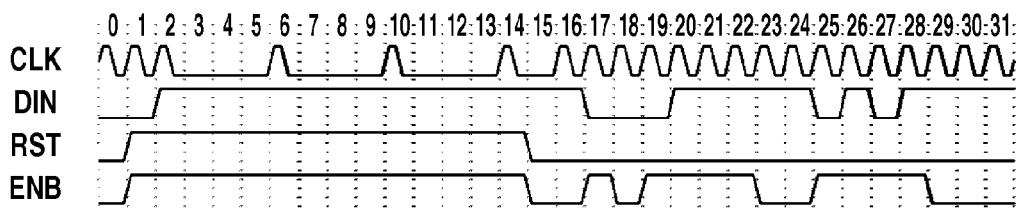

FIG. 5C is the timing chart illustrating the operation of the circuit illustrated in FIG. 4B. As illustrated in FIG. 5C, the control signal ENB is at an H level at timing when the flip-flop 202 is set in a state to perform a latching operation. A clock signal CLK is a clock where clock pulses have been thinned from the clock signal CLOCK during the resetting period as described above.

Figure 5D:
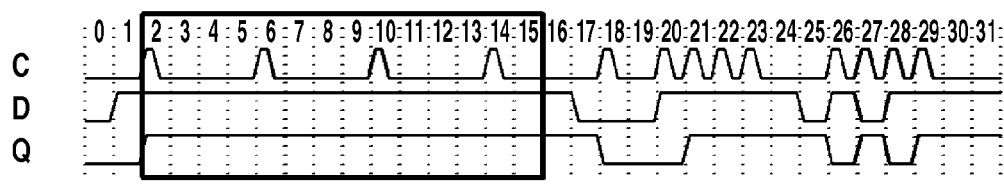

FIG. 5D is the timing chart illustrating the operation of the flip-flop 202 in the timing chart illustrated in FIG. 5C. A connection configuration of the clock gating cell of the flip-flop 202 is similar to that of the flip-flop 201, and hence a clock input to the clock terminal C is a clock subjected to clock gating as in the case illustrated in FIG. 5B. The resetting period is a period from a cycle 2 to a cycle 15 enclosed by a heavy-line frame, and the flip-flop is initialized at the cycle 2.

Figure 5E:
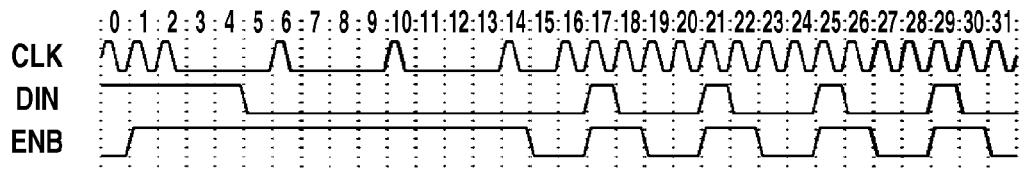

FIG. 5E is the timing chart illustrating the operation of the circuit illustrated in FIG. 4C. An input data signal DIN is an output data signal of the flip-flop 501 of the circuit block D 5. The control signal ENB is at an H level at timing when the flip-flop 203 is set in a state to perform a latching operation. A clock signal CLK is a clock where clock pulses have been thinned from the clock signal CLOCK during the resetting period as described above.

Figure 5F:
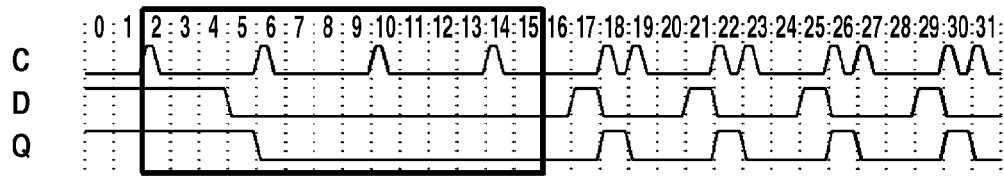

FIG. 5F is the timing chart illustrating the operation of the flip-flop 203 in the timing chart illustrated in FIG. 5E. A connection configuration of the clock gating cell of the flip-flop 203 is similar to that of the flip-flop 201, and hence a clock input to the clock terminal C is a clock subjected to clock gating as in the case illustrated in FIG. 5B.

The resetting period is a period from a cycle 2 to a cycle 15 enclosed by a heavy-line frame, and the flip-flop is initialized at the cycle 6. The flip-flop 203 is the flip-flop with no reset as described above, and hence a value input to the input data terminal D directly becomes an initialization value. Thus, to initialize the flip-flop 203 without any problems, all the previous flip-flops must be initialized during the resetting period to establish initialization values thereof. A data signal input to the input data terminal D of the flip-flop 203 is an output data signal of the flip-flop 501 of the circuit block D 5 as described above. The flip-flop 501 is completed for initialization to be established at the cycle 5 during the resetting period as described below with reference to FIG. 7F. Thus, the flip-flop 203 with no reset can be initialized without any problems.

FIGS. 6A to 6C illustrate operations and magnitudes of consumption currents of the flip-flops 201, 202, and 203 in the timing charts illustrated in FIGS. 5A to 5F. FIG. 6A illustrates the operation and the magnitude of the consumption current of the flip-flop 201 in the timing chart illustrated in FIG. 5B. As elements to increase a consumption current value, as described above, there are presence or absence of a latching operation and presence or absence of a toggle operation. Thus, presence or absence of an input of a clock pulse to each corresponding clock terminal C, and presence or absence of a change in value output from the data output terminal Q are listed in a table for each clock cycle.

A row of a C input represents presence or absence of an input of a clock pulse to the clock terminal C, an "X" mark indicating "YES" (there is input), and a blank indicating "NO" (there is no input). A row of a Q change represents presence or absence of a change in value output from the data output terminal Q, an "X" mark indicating "YES" (there is change), and a blank indicating "NO" (there is no change).

A row of consumption current represents magnitudes of current values consumed by the flip-flop 201 and the peripheral circuit (not illustrated) during a clock synchronous operation. Magnitudes of consumption currents are determined based on the input of the clock pulse to the clock terminal and the value output from the data output terminal Q as described above, and classified as follows: a clock cycle where a C input and a Q output are both "YES", a clock cycle where only a C input is "YES", and a clock cycle where both are "NO".

An order of the clock cycle where there are both, the clock cycle where there is only a C input, and the clock cycle where there is neither is in magnitudes "H", "M", and "L" of consumption currents. A period from the cycle 2 to the cycle 15 enclosed by a heavy line frame is a resetting period.

FIG. 6B is a table illustrating the operation and the magnitude of the consumption current of the flip-flop 202 in the timing chart illustrated in FIG. 5D, which are represented as in the case of FIG. 6A. A row of a C input and a row of a Q change are similar to those illustrated in FIG. 6A. A row of consumption current indicates magnitudes of current values consumed by the flip-flop 202 and the peripheral circuit (not illustrated) during a clock synchronous operation. The magnitude of the consumption current is represented as in the case of FIG. 6A.

FIG. 6C is a table illustrating the operation and the magnitude of the consumption current of the flip-flop 203 in the timing chart illustrated in FIG. 5F, which are represented as in the case of FIG. 6A. A row of consumption current indicates magnitudes of current values consumed by the flip-flop 203 and the peripheral circuit (not illustrated) during a clock synchronous operation. The magnitude of the consumption current is represented as in the case of FIG. 6A.

Figure 7A:
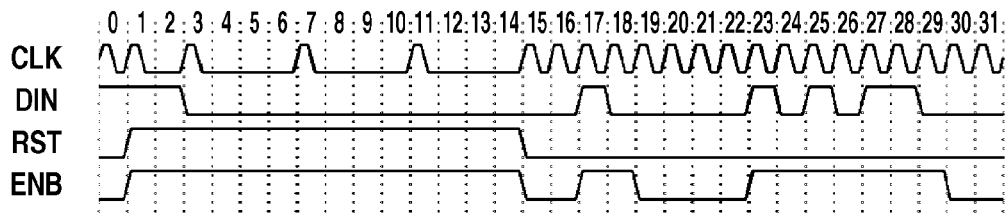
FIGS. 7A to 7F are timing charts illustrating operations of peripheral circuits of the flip-flops.

FIGS. 7A to 7F are timing charts illustrating operations of the flip-flops 301, 401, and 501 and the peripheral circuits. FIG. 7A is the timing chart illustrating the operation of the peripheral circuit of the flip-flop 301. The flip-flop 301 has a connection configuration similar to that of the flip-flop 201 illustrated in FIG. 4A. The flip-flop 301 is included in the circuit block B 3, and hence a clock signal CLOCK_B is input to the peripheral circuit of the flip-flop 301. Thus, FIG. 7A illustrates a waveform of a clock signal CLK different from that in the timing chart of the peripheral circuit of the flip-flop 201 illustrated in FIG. 5A.

A control signal ENB is at an H level at timing when the flip-flop 301 is set in a state to perform a latching operation. The clock signal CLK becomes a clock where clock pulses are thinned from the clock signal CLOCK during the resetting period as described above.

Figure 7B:
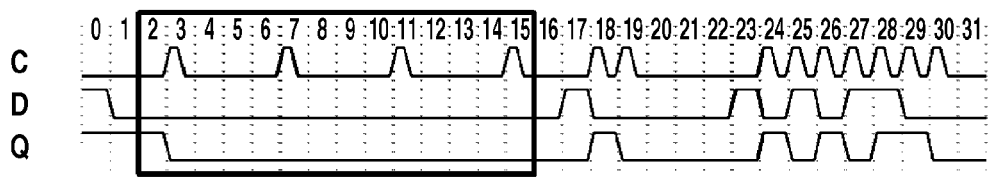

FIG. 7B is the timing chart illustrating the operation of the flip-flop 301 in the timing chart illustrated in FIG. 7A. A clock gating cell connection configuration of the flip-flop 301 is similar to that of the flip-flop 201, and hence a clock input to the clock terminal C is subjected to clock gating as in the case of FIG. 5B. A resetting period is a period from a cycle 2 to a cycle 15 enclosed by an illustrated heavy line frame, and the flip-flop 301 is initialized at the cycle 3.

Figure 7C:
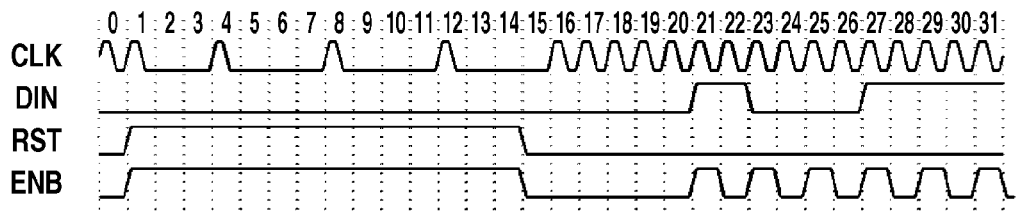

FIG. 7C is the timing chart illustrating the operation of the peripheral circuit of the flip-flop 401. The flip-flop 401 has a connection configuration similar to that of the flip-flop 201 illustrated in FIG. 4A. The flip-flop 401 is included in the circuit block C 4, and hence a clock signal CLOCK_C is input. Thus, FIG. 7C has a waveform of a clock signal CLK different from that in the timing chart of the peripheral circuit of the flip-flop 201 illustrated in FIG. 5A. A control signal ENB is at an H level at timing when the flip-flop 401 is set in a state to perform a latching operation. The clock signal CLK becomes a clock where clock pulses are thinned from the clock signal CLOCK during the resetting period as described above.

Figure 7D:
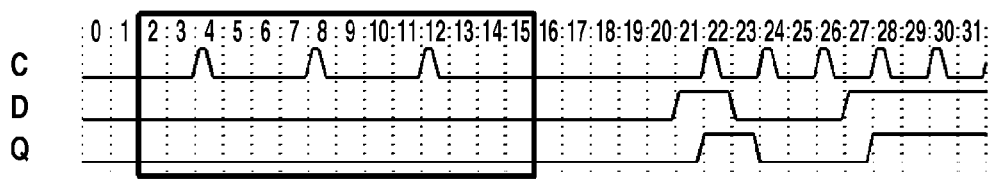

FIG. 7D is the timing chart illustrating the operation of the flip-flop 401 in the timing chart illustrated in FIG. 7C. A clock gating cell connection configuration of the flip-flop 401 is similar to that of the flip-flop 201, and hence a clock input to the clock terminal C is subjected to clock gating as in the case of FIG. 5B. A resetting period is a period from a cycle 2 to a cycle 15 enclosed by an illustrated heavy line frame. The flip-flop 401 is initialized at the cycle 4. However, a stored value is not changed.

Figure 7E:
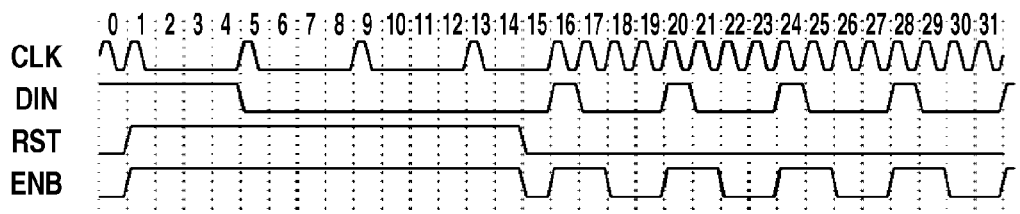

FIG. 7E is the timing chart illustrating the operation of the peripheral circuit of the flip-flop 501. The flip-flop 501 has a connection configuration similar to that of the flip-flop 201 illustrated in FIG. 4A. The flip-flop 501 is included in the circuit block D 5, and hence a clock signal CLOCK_C is input. Thus, FIG. 7E has a waveform of a clock signal CLK different from that in the timing chart of the peripheral circuit of the flip-flop 201 illustrated in FIG. 5A. A control signal ENB is at an H level at timing when the flip-flop 501 is set in a state to perform a latching operation. The clock signal CLK becomes a clock where clock pulses are thinned from the clock signal CLOCK during the resetting period as described above.

Figure 7F:
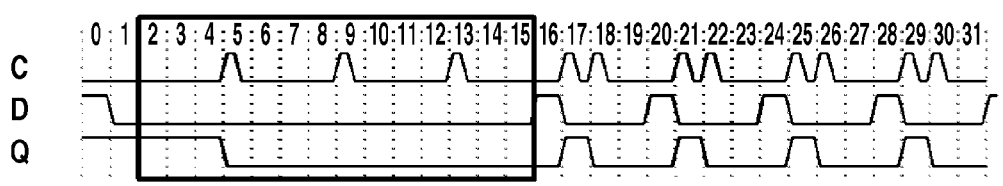

FIG. 7F is the timing chart illustrating the operation of the flip-flop 501 in the timing chart illustrated in FIG. 7E. A clock gating cell connection configuration of the flip-flop 501 is similar to that of the flip-flop 201, and hence a clock input to the clock terminal C is subjected to clock gating as in the case of FIG. 5B. A resetting period is a period from a cycle 2 to a cycle 15 enclosed by an illustrated heavy line frame. The flip-flop 501 is initialized at the cycle 5. A data signal DOUT the output data terminal Q is connected to the input data terminal D of the flip-flop 203.

FIGS. 8A to 8C illustrate operations and magnitudes of consumption currents of the flip-flops 301, 401, and 501 in the timing charts illustrated in FIGS. 7A to 7F, which are represented as in the case of FIGS. 6A to 6C. FIG. 8A is a table illustrating the operation and the magnitude of the consumption current of the flip-flop 301 in the timing chart illustrated in FIG. 7B, which are represented as in the case of FIG. 6A. A row of a C input and a row of a Q change are similar to those illustrated in FIG. 6A. A row of consumption current indicates magnitudes of current values consumed by the flip-flop 301 and the peripheral circuit (not illustrated) during a clock synchronous operation. The magnitude of the consumption current is represented as in the case of FIG. 6A.

FIG. 8B is a table illustrating the operation and the magnitude of the consumption current of the flip-flop 401 in the timing chart illustrated in FIG. 7D, which are represented as in the case of FIG. 6A. A row of a C input and a row of a Q change are similar to those illustrated in FIG. 6A. A row of consumption current indicates magnitudes of current values consumed by the flip-flop 401 and the peripheral circuit (not illustrated) during a clock synchronous operation. The magnitude of the consumption current is represented as in the case of FIG. 6A.

FIG. 8C is a table illustrating the operation and the magnitude of the consumption current of the flip-flop 501 in the timing chart illustrated in FIG. 7F, which are represented as in the case of FIG. 6A. A row of a C input and a row of a Q change are similar to those illustrated in FIG. 6A. A row of consumption current indicates magnitudes of current values consumed by the flip-flop 501 and the peripheral circuit (not illustrated) during a clock synchronous operation. The magnitude of the consumption current is represented as in the case of FIG. 6A.

Figure 9:
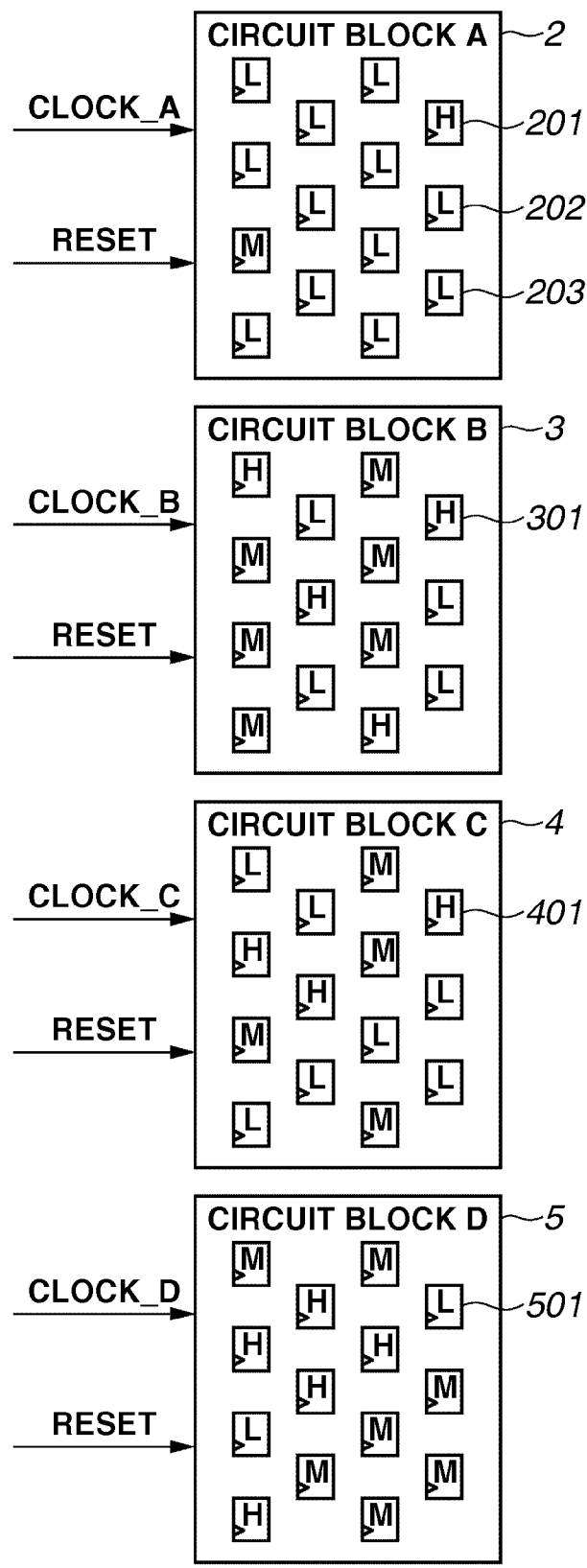
FIG. 9 is a block diagram illustrating magnitudes of current values consumed by the flip-flops and the peripheral circuits illustrated in FIG. 3 at a given clock cycle during the normal operation.

FIG. 9 is a block diagram illustrating magnitudes of current values consumed by the flip-flops and the peripheral circuits illustrated in FIG. 3 at a given clock cycle during the normal operation. The given clock cycle means the cycle 24 illustrated in FIGS. 6A to 6C and FIGS. 8A to 8C. The illustrated magnitudes of the consumption current values are represented as in the case of FIGS. 6A to 6C and FIGS. 8A to 8C.

A total of consumption current values of all the flip-flops in the circuit block becomes a consumption current value of the circuit block as a whole. The consumption current value of the circuit block as a whole changes from one cycle to another according to logical design contents of the circuit block. A largest value during the normal operation is referred to as a maximum consumption current value during the normal operation. It is presumed that in this illustrated state, the value is a maximum consumption current value during the normal operation.

Figure 10:
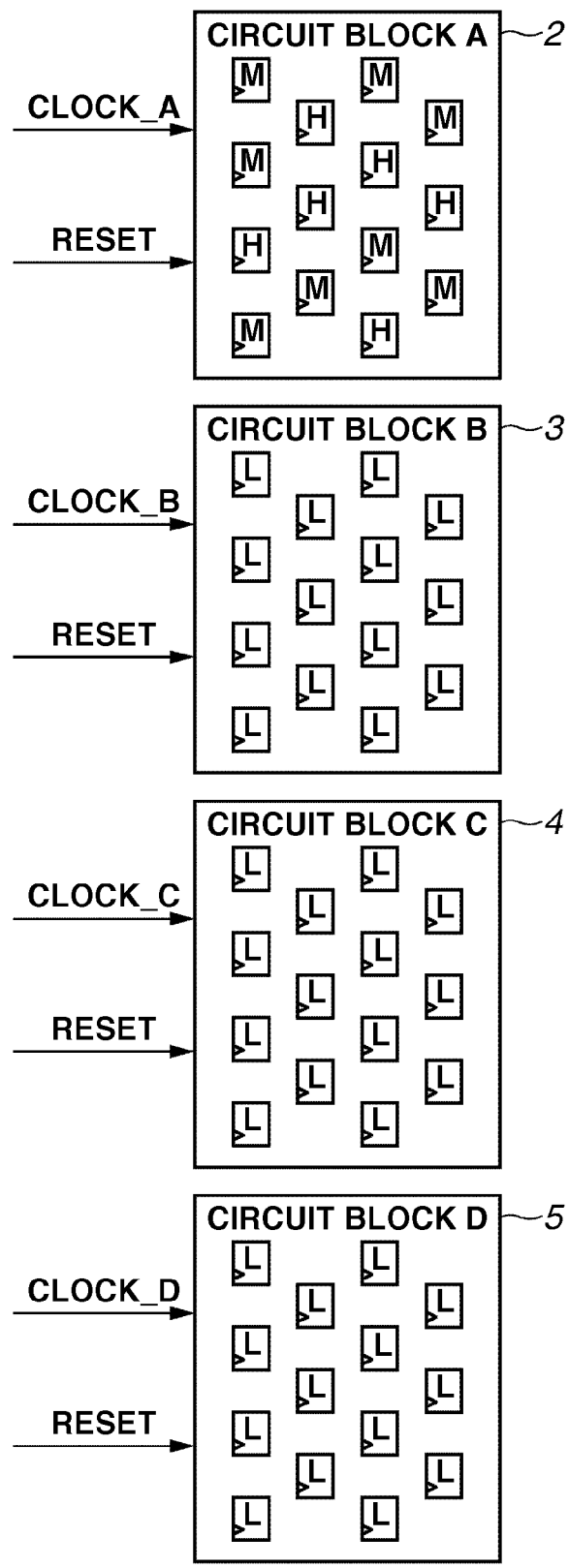
FIG. 10 is a block diagram illustrating magnitudes of current values consumed by the flip-flops and the peripheral circuits illustrated in FIG. 3 at a given clock cycle during initialization in the resetting period.

FIG. 10 is a block diagram illustrating magnitudes of consumption current values of the flip-flops and the peripheral circuits illustrated in FIG. 3 at a given clock cycle during an initialization operation in the resetting period. The given clock cycle means the cycle 2 illustrated in FIGS. 6A to 6C and FIGS. 8A to 8C. The illustrated magnitudes of the consumption current are represented as in the case of FIGS. 6A to 6C and FIGS. 8A to 8C.

At this clock cycle, clocks are supplied to all the flip-flops in the circuit block A 2, and hence all the flip-flops of the circuit A 2 consume current based on an input of a clock pulse to the clock terminal C. The flip-flops that perform initialization operations consume current based on a change in value output from the data output terminal Q. Thus, consumption current values are "H" or "M" at the flip-flops of the circuit block A 2.

At this clock cycle, the flip-flops of the circuit block B 3, the circuit block C 4, and the circuit block D 5 have no clock supplied, and hence consumption current values are "L".

A largest consumption current value of the circuit block as a whole during the resetting period is referred to as a maximum consumption current value during the resetting operation. In this illustrated state, the value is a maximum consumption current value during the resetting operation.

During the initialization operation in the resetting period, in addition to the illustrated state, there is a clock cycle at which a clock is supplied to only one of the circuit block B 3, the circuit block C 4, and the circuit block D 5. Such clock cycles are the cycle 3, the cycle 4, and the cycle 5 in FIGS. 6A to 6C and FIGS. 8A to 8C. States at these clock cycles are determined based on logical circuit design contents. In the present exemplary embodiment, it is presumed that the number of flip-flops having consumption current values "H" is smaller than that in the state illustrated in FIG. 10.

Figure 11:
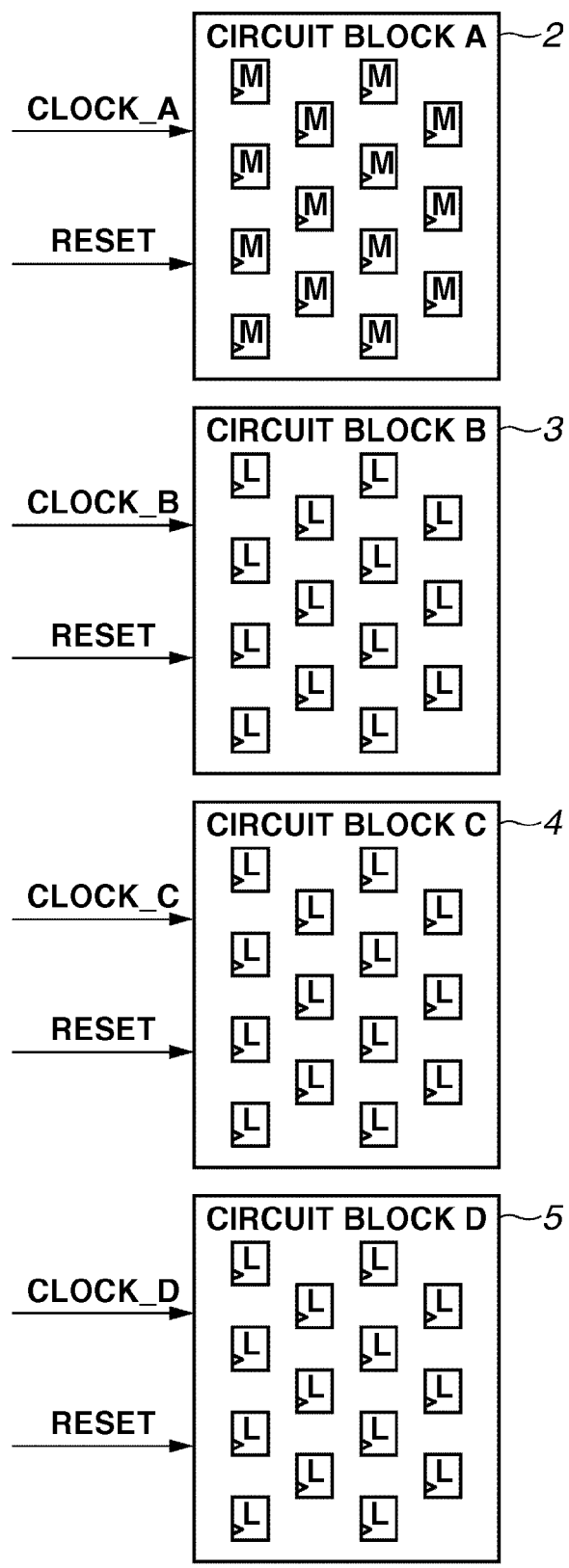
FIG. 11 is a block diagram illustrating magnitudes of current values consumed by the flip-flops and the peripheral circuits illustrated in FIG. 3 at a given clock cycle in a steady state after initialization in the resetting period.

FIG. 11 is a block diagram illustrating magnitudes of consumption current values of the flip-flops and the peripheral circuits illustrated in FIG. 3 at a given clock cycle in steady states after initialization during the resetting period. The given clock cycle means the cycle 10 illustrated in FIGS. 6A to 6C and FIGS. 8A to 8C. The illustrated magnitudes of the current values are represented as in the case of FIGS. 6A to 6C and FIGS. 8A to 8C.

At this cycle, clocks are supplied to all the flip-flops of the circuit block A 2, and hence all the flip-flops of the circuit block A 2 consume current based on an input of a clock pulse to the clock terminal C. All the flip-flops have been initialized. Thus, a change in value output from the data output terminal Q causes no increase in consumption current value. Consumption current values are accordingly "M" at all the flip-flops of the circuit block A 2.

At this cycle, because no clock is supplied, consumption current values are "L" in the circuit block B 3, the circuit block C 4, and the circuit block D 5. A maximum consumption current value after initialization of all the flip-flops during the resetting period is referred to as a steady maximum consumption current value during the resetting operation. It is presumed that in this illustrated state, the value is a steady maximum consumption current value during the resetting operation.

During the resetting period, in addition to the illustrated state, there is a clock cycle at which a clock is supplied to only one of the circuit block B 3, the circuit block C 4, and the circuit block D 5. Such clock cycles are the cycle 11, the cycle 12, and the cycle 13 illustrated in FIGS. 6A to 6C and FIGS. 8A to 8C. States at these clock cycles are determined based on logical circuit designs. However, when the number of flip-flops where consumption current values are "M" or "L" is not changed from that in the state illustrated in FIG. 11, consumption current values are similar to those illustrated in FIG. 11.

Figure 12:
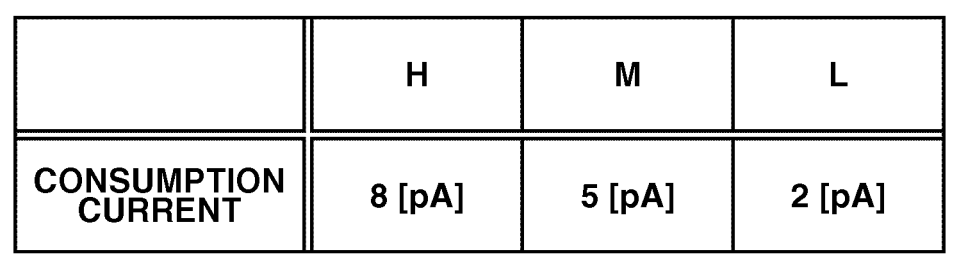

FIG. 12 illustrates a relationship between the consumption current values "H", "M", and "L" illustrated in FIGS. 6A to 6C, FIGS. 8A to 8C, and FIGS. 9 to 11 and actual current values. An actual consumption current value is present in a device that includes a circuit block, and changes depending on contents of the peripheral circuit of the flip-flop. In this case, to calculate a consumption current value, a modeled value is uniquely allocated.

FIGS. 13A to 13C illustrate consumption current values in a state during the normal operation period, a state during the initialization operation in the resetting period, and a steady state after the initialization illustrated in FIGS. 9 to 11.

FIG. 13A illustrates consumption current values in the state during the normal operation period illustrated in FIG. 9. The number of consumption current values "H" is 13, the number of values "M" is 18, and the number of values "L" is 25, and thus a total consumption current value is 244 [pA]. As described above, this value is a maximum consumption current value during the normal operation.

FIG. 13B illustrates consumption current values in the state during the initialization in the resetting period illustrated in FIG. 10. The number of consumption current values "H" is 6, the number of values "M" is 8, and the number of values "L" is 42, and thus a total consumption current value is 172[pA].

As described above, this value is a maximum consumption current value during the resetting operation.

FIG. 13C illustrates consumption current values in the steady state after the initialization in the resetting period illustrated in FIG. 11. The number of consumption current values "H" is 0, the number of values "M" is 1, and the number of values "L" is 42, and thus a total consumption current value is 154[pA]. As described above, this value is a steady maximum consumption current value during the resetting operation.

As described above, the clock supply apparatus 1 can be configured by the circuits that use clock gating by an enable signal generated based on a counter value during the resetting period. According to the clock supply apparatus 1, the plurality of circuit blocks including the flip-flops with no resets can all be reset surely (cycle 5 illustrated in FIG. 5F). The maximum consumption current value during the resetting operation can be set smaller than that during the normal operation (FIGS. 13A to 13C).

For comparison with the clock supply apparatus according to the present exemplary embodiment, two conventional examples of clock supply apparatuses are described.

[First Conventional Clock Supply Apparatus]

In the first conventional clock supply apparatus, a maximum consumption current value during a resetting operation is larger than that during a normal operation. Only components different from those of the clock supply apparatus according to the first exemplary embodiment are described.

Figure 25:
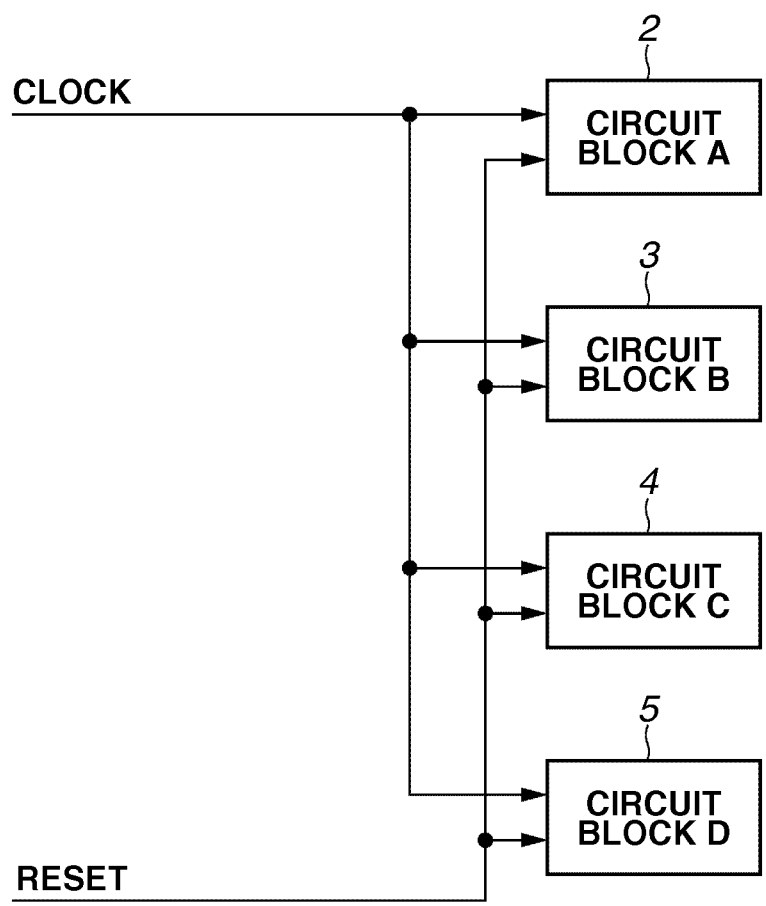
FIG. 25 is a block diagram illustrating an external connection configuration of a first conventional clock supply apparatus.

FIG. 25 is a block diagram illustrating an external connection configuration of the first conventional clock supply apparatus. As illustrated in FIG. 25, the conventional clock supply apparatus includes only wires. Different from the clock supply apparatus 1 according to the first exemplary embodiment, there is neither a control signal generation unit 101 nor a clock control unit 102.

Figure 26:
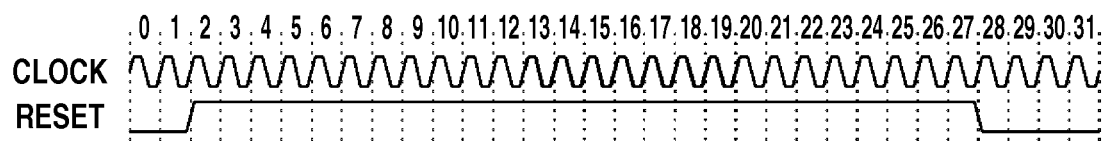
FIG. 26 is a timing chart illustrating an operation of the first conventional clock supply apparatus.

FIG. 26 is a timing chart illustrating an operation of the first conventional clock supply apparatus. As illustrated in FIG. 26, in the first conventional clock supply apparatus, a clock signal CLOCK input to each circuit block is not changed during a resetting period.

Figure 27A:
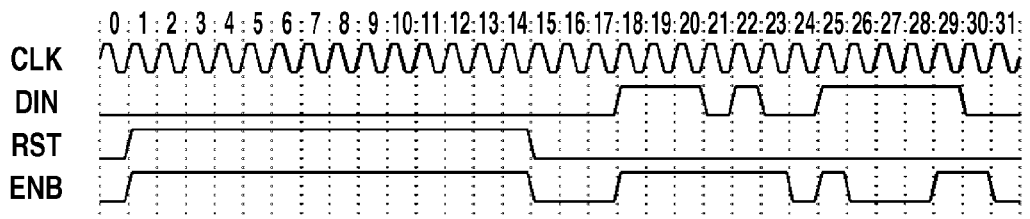
FIGS. 27A to 27F are timing charts illustrating operations of the circuits and the flip-flops illustrated in FIGS. 4A to 4C based on clocks input from the first conventional clock supply apparatus.

FIGS. 27A to 27F are timing charts illustrating operations of the circuits and the flip-flops 201, 202, and 203 illustrated in FIGS. 4A to 4C. FIGS. 27A to 27F correspond to FIGS. 5A to 5C according to the first exemplary embodiment, and are different from FIGS. 5A to 5F in operation of clock signals CLK during the resetting operation. FIG. 27A is the timing chart illustrating the operation of the peripheral circuit of the flip-flop 201 based on a clock input from the first conventional clock supply apparatus. FIG. 27A corresponds to FIG. 5A according to the first exemplary embodiment, and is different from FIG. 5A in operation of the clock signal CLK during the resetting period.

Figure 27B:
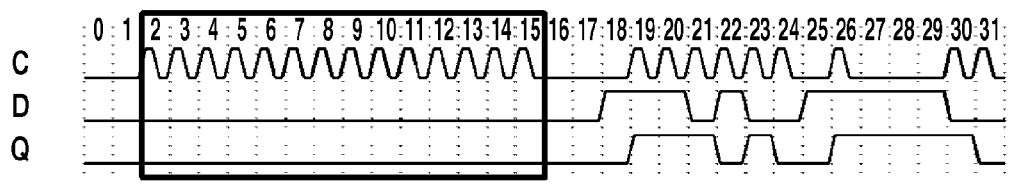

FIG. 27B is the timing chart illustrating the operation of the flip-flop 201 in the timing chart illustrated in FIG. 27A. FIG. 27B corresponds to FIG. 5B according to the first exemplary embodiment, and is different from FIG. 5B in operation of the clock signal CLK during the resetting period.

Figure 27C:
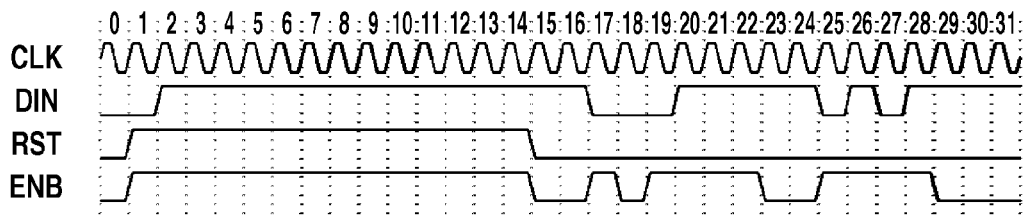

FIG. 27C is the timing chart illustrating the operation of the peripheral circuit of the flip-flop 202 based on a clock input from the first conventional clock supply apparatus. FIG. 27C corresponds to FIG. 5C according to the first exemplary embodiment, and is different from FIG. 5C in operation of the clock signal CLK during the resetting period.

Figure 27D:
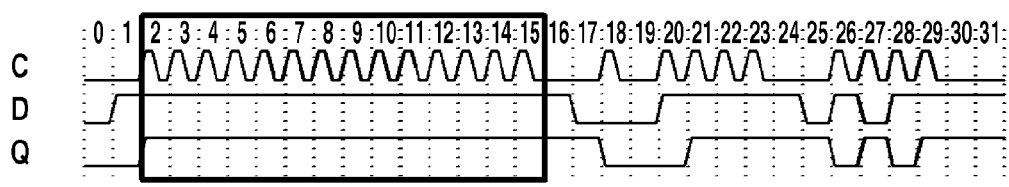

FIG. 27D is the timing chart illustrating the operation of the flip-flop 202 in the timing chart illustrated in FIG. 27C. FIG. 27D corresponds to FIG. 5D according to the first exemplary embodiment, and is different from FIG. 5D in operation of the clock signal CLK during the resetting period.

Figure 27E:
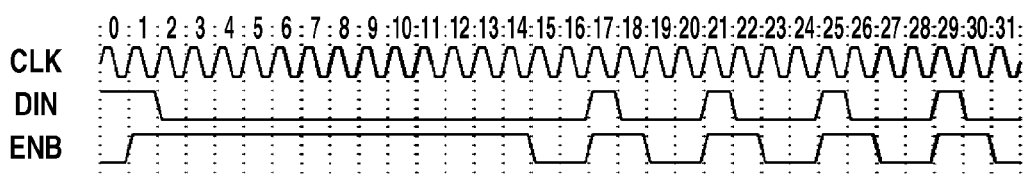

FIG. 27E is the timing chart illustrating the operation of the peripheral circuit of the flip-flop 203 based on a clock input from the first conventional clock supply apparatus. FIG. 27E corresponds to FIG. 5E according to the first exemplary embodiment, and is different from FIG. 5E in operation of the clock signal CLK during the resetting period.

Figure 27F:
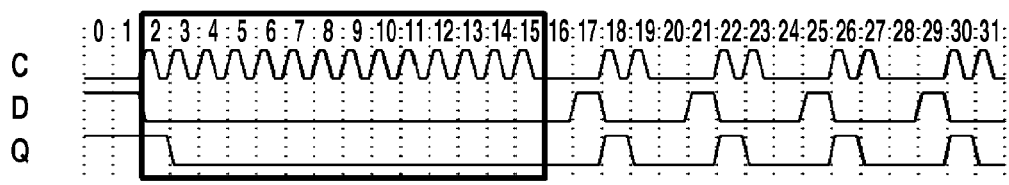

FIG. 27F is the timing chart illustrating the operation of the flip-flop 203 in the timing chart illustrated in FIG. 27E. FIG. 27F corresponds to FIG. 5F according to the first exemplary embodiment, and is different from FIG. 5F in operation of the clock signal CLK during the resetting period.

FIGS. 28A to 28C illustrate operations and magnitudes of consumption currents of the flip-flops 201, 202, and 203 in the timing charts illustrated in FIGS. 27A to 27F. FIGS. 28A to 28C correspond to FIGS. 6A to 6C according to the first exemplary embodiment, and different from FIGS. 6A to 6C in presence or absence of a C input during the resetting period and magnitudes of consumption currents.

FIG. 28A illustrates the operation and the magnitude of the consumption current of the flip-flop 201 in the timing chart illustrated in FIG. 27B. FIG. 28A corresponds to FIG. 6A according to the first exemplary embodiment, and is different from FIG. 6A in presence or absence of the C input during the resetting period and magnitude of the consumption current.

FIG. 28B illustrates the operation and the magnitude of the consumption current of the flip-flop 202 in the timing chart illustrated in FIG. 27D. FIG. 28B corresponds to FIG. 6B according to the first exemplary embodiment, and is different from FIG. 6B in presence or absence of the C input during the resetting period and magnitude of the consumption current.

FIG. 28C illustrates the operation and the magnitude of the consumption current of the flip-flop 203 in the timing chart illustrated in FIG. 27F. FIG. 28C corresponds to FIG. 6C according to the first exemplary embodiment, and is different from FIG. 6C in presence or absence of the C input during the resetting period and magnitude of the consumption current.

Timing charts, operations, and magnitudes of consumption currents of flip-flops 301, 401, and 501 based on a clock input from the first conventional clock supply apparatus are not illustrated. The timing charts, the operations, and the magnitudes of the consumption currents of the flip-flops 301, 401, and 501 are similar to those of the flip-flops 201, 202, and 203. In other words, the clock input from the first conventional clock supply apparatus is different from the clock input from the clock supply apparatus according to the first exemplary embodiment in operation of clock signals CLK. Thus, presence or absence of a C input and the magnitude of the consumption current of each flip-flop during the resetting period are different.

Figure 29:
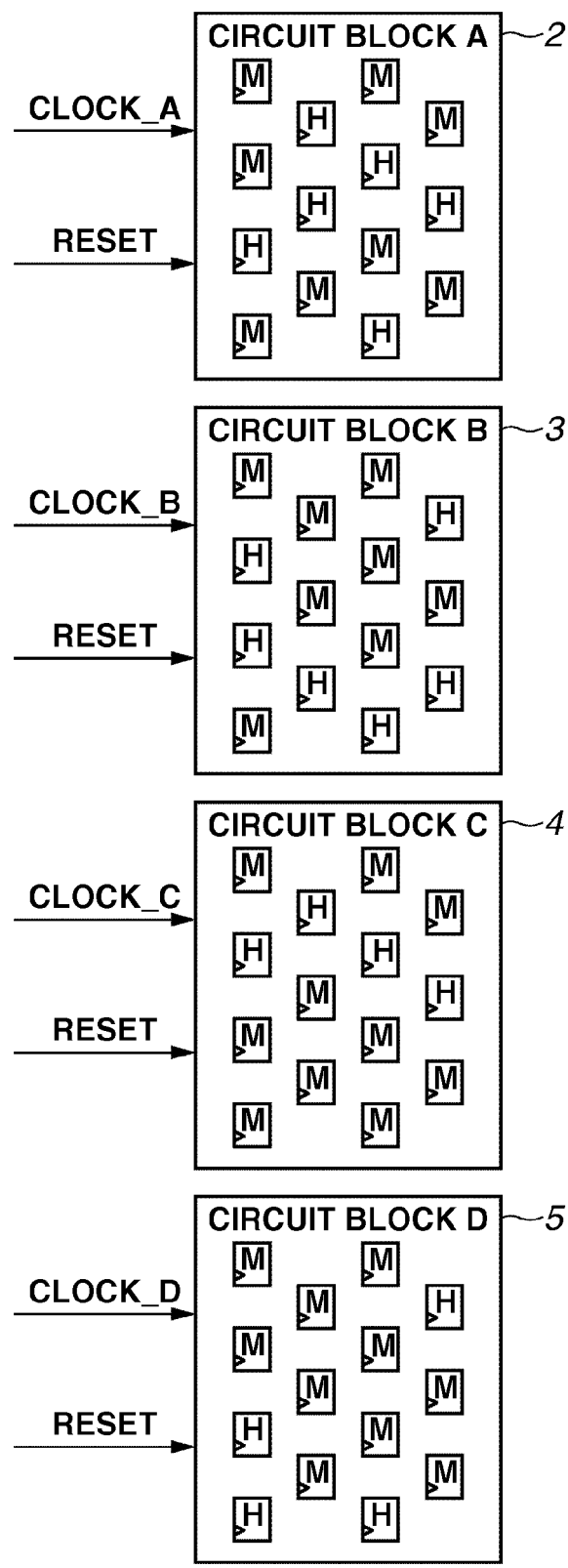
FIG. 29 is a block diagram illustrating magnitudes of current values consumed by the flip-flops and the peripheral circuits illustrated in FIG. 3 at a given clock cycle during initialization in a resetting period based on the clocks input from the first conventional clock supply apparatus.

FIG. 29 is a block diagram illustrating magnitudes of consumption current values of the flip-flops and the peripheral circuits illustrated in FIG. 3 at a given clock cycle during the initialization operation in the resetting period based on a clock input from the first conventional clock supply apparatus. The given clock cycle means a cycle 2 illustrated in FIGS. 28A to 28C. FIG. 29 corresponds to FIG. 10 according to the first exemplary embodiment, and is different from FIG. 10 in that there is no flip-flop having a consumption current value "L".

Figure 30:
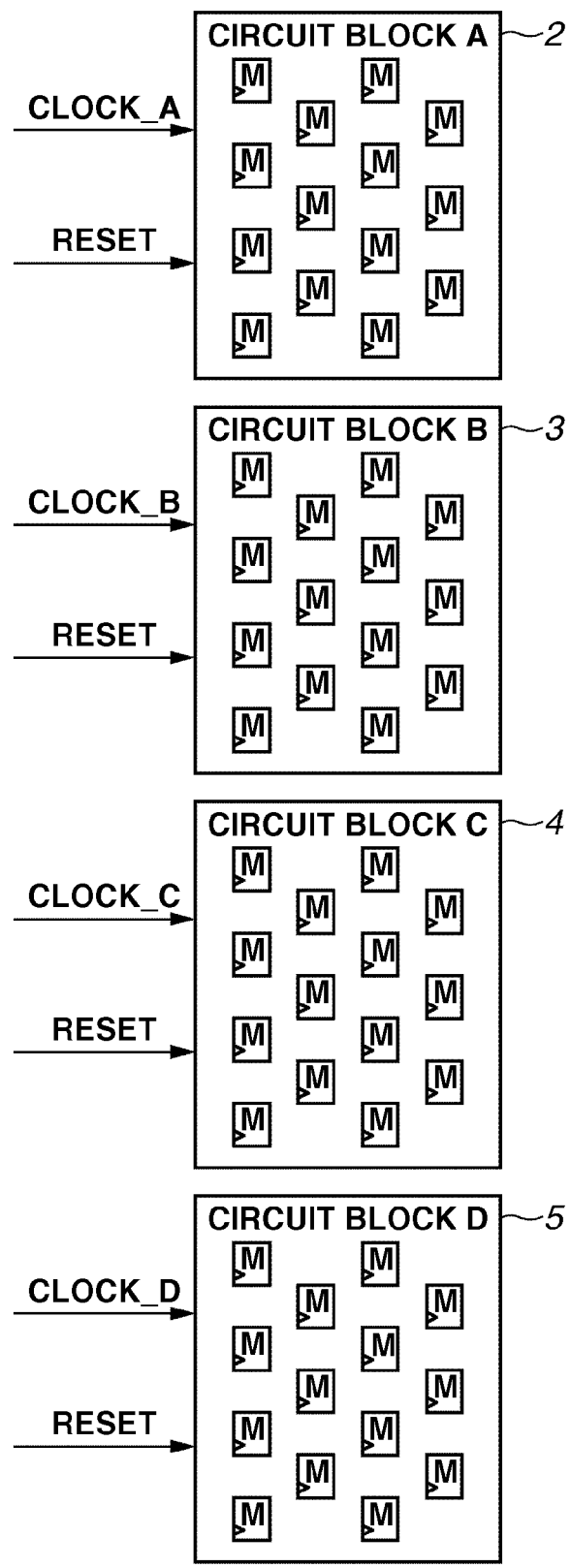
FIG. 30 is a block diagram illustrating magnitudes of current values consumed by the flip-flops and the peripheral circuits illustrated in FIG. 3 at a given clock cycle in a steady state after initialization in the resetting period based on the clocks input from the first conventional clock supply apparatus.

FIG. 30 is a block diagram illustrating magnitudes of consumption current values of the flip-flops and the peripheral circuits illustrated in FIG. 3 at a given clock cycle in a steady state after initialization during the resetting period based on the clock input from the first conventional clock supply apparatus. The given clock cycle means a cycle 10 illustrated in FIGS. 28A to 28C. FIG. 30 corresponds to FIG. 11 according to the first exemplary embodiment, and is different from FIG. 11 in that there is no flip-flop having a consumption current value "L".

FIGS. 31A and 31B illustrate consumption current values in a state during the initialization operation in the resetting period, and a steady state after the initialization illustrated in FIGS. 29 and 30 based on the clock input from the first conventional clock supply apparatus.

FIG. 31A illustrates the consumption current values in the state during the initialization in the resetting period illustrated in FIG. 29. The number of consumption current values "H" is 6, the number of values "M" is 50, and the number of values "L" is 0, and thus a total consumption current value is 298 [pA]. A maximum consumption current value during a normal operation is equal to that in the first exemplary embodiment (244[pA] illustrated in FIG. 13A).

As described above, this value is a maximum consumption current value during the resetting operation in the first conventional clock supply apparatus, which is larger than that (244[pA]) in the state during the normal operation.

FIG. 31B illustrates consumption current values in the steady state after the initialization in the resetting period illustrated in FIG. 30. The number of consumption current values "H" is 0, the number of values "M" is 56, and the number of values "L" is 0, and thus a total consumption current value is 280[pA]. As described above, this value is a steady maximum consumption current value during the resetting operation, which is larger than the consumption current value (244[pA]) in the state during the normal operation.

As described above, in the case of the clock input to each circuit block from the first conventional clock supply apparatus, the maximum consumption current value during the resetting period is larger than that during the normal operation.

[Second Conventional Clock Supply Apparatus]

Next, a second conventional clock supply apparatus is described. Only components different from those of the clock supply apparatus according to the first exemplary embodiment are described. The second conventional clock supply apparatus inputs independent clocks to a plurality of circuit blocks to prevent overlapping of resetting periods of the circuit blocks during a resetting operation. The second conventional clock supply apparatus can reduce instantaneous consumption current per clock cycle by controlling not to supply clocks to all the circuit blocks simultaneously during the resetting period.

Figure 32:
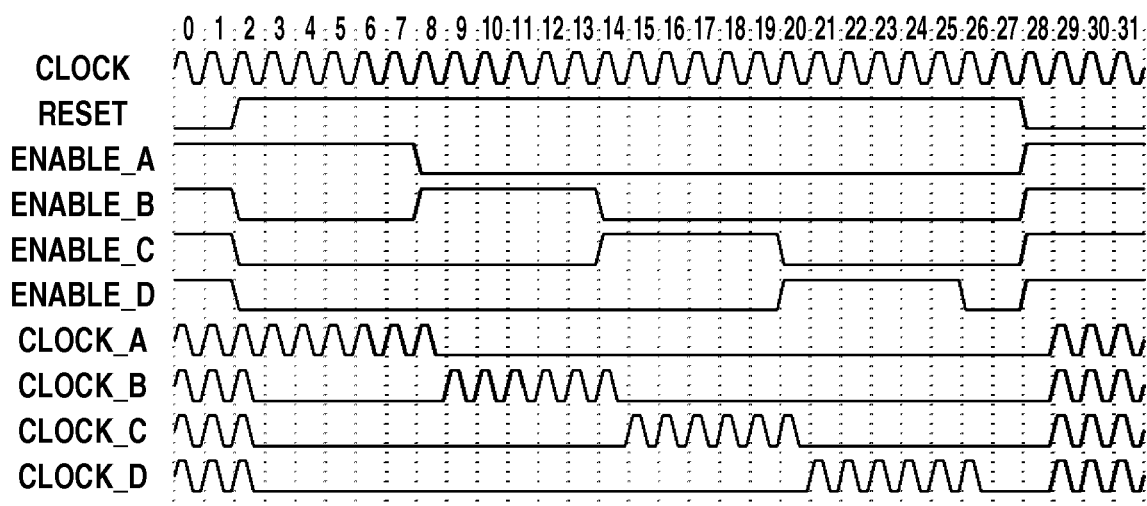
FIG. 32 is a timing chart illustrating an operation of a second conventional clock supply apparatus.

FIG. 32 is a timing chart illustrating an operation of the second conventional clock supply apparatus. In the second conventional clock apparatus, a plurality of control signals ENABLE_A, ENABLE_B, ENABLE_C, and ENABLE_D are generated not to be at H levels simultaneously while a reset signal is at an H level. Output clock signals CLOCK_A, CLOCK_B, CLOCK_C, and CLOCK_D are signals where clock signals have been thinned according to the plurality of control signals. FIG. 32 corresponds to FIG. 2C according to the first exemplary embodiment, and is different from FIG. 2C in that the clock signals are generated to set individual resetting periods for circuit blocks.

Figure 33A:
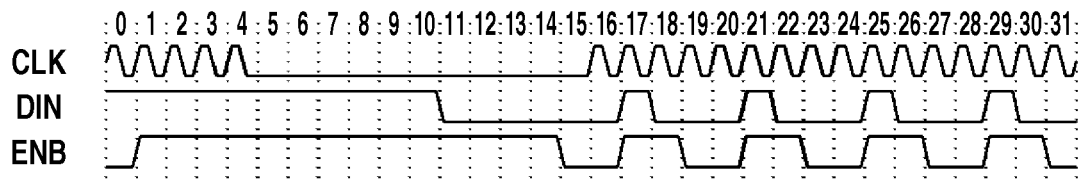
FIGS. 33A to 33D are timing charts illustrating operations of peripheral circuits of flip-flops, and the flip-flops based on clocks input from the second conventional clock supply apparatus.

FIGS. 33A to 33D are timing charts illustrating operations of a peripheral circuit of a flip-flop 203, the flip-flop 203, a peripheral circuit of a flip-flop 501, and the flip-flop 501 based on a clock input from the second conventional clock supply apparatus. FIG. 33A is the timing chart illustrating the operation of the peripheral circuit of the flip-flop 203 based on the clock input from the second conventional clock supply apparatus. FIG. 33A corresponds to FIG. 5E according to the first exemplary embodiment, and is different from FIG. 5E in operation of a clock signal CLK during a resetting period. An input data signal DIN is an output data signal of the flip-flop 501.

Figure 33B:
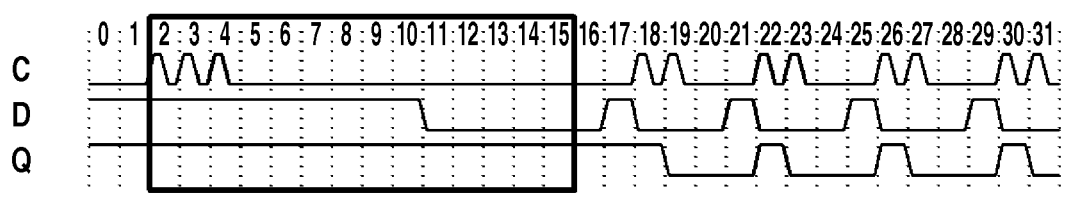

FIG. 33B is the timing chart illustrating the operation of the flip-flop 203 in the timing chart illustrated in FIG. 33A. A resetting period is a period from a cycle 2 to a cycle 15 enclosed by a heavy-line frame, and the flip-flop 203 is initialized at cycles 2, 3, and 4. The flip-flop 203 is the flip-flop with no reset as described above, and hence a value input to an input data terminal directly becomes an initialization value. Thus, to initialize the flip-flop 203 without any problems, all the previous flip-flops must be initialized during the resetting period to establish initialization values thereof. A data signal input to the input data terminal C of the flip-flop 203 is an output data signal of the flip-flop 501 as described above. The flip-flop 501 is completed for initialization to be established at the cycle 11 during the resetting period described below. Thus, in the case of the clock input from the second conventional clock supply apparatus, the flip-flop 203 that is a flip-flop with no reset and initialized before the cycle 11 at which the initialization value of the previous flip-flop 501 is established cannot be initialized.

Figure 33C:
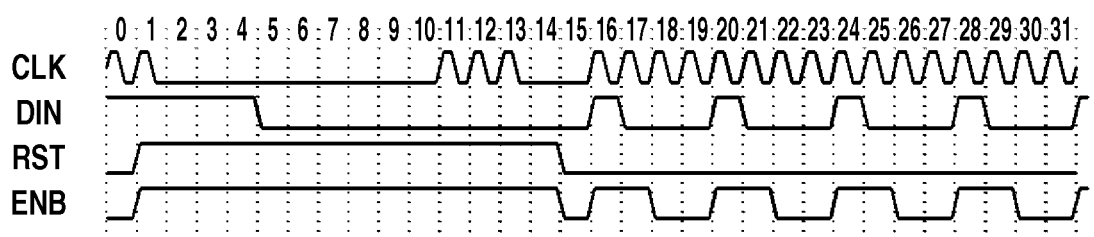

FIG. 33C is the timing chart illustrating the operation of the peripheral circuit of the flip-flop 501 based on the clock input from the second conventional clock supply apparatus. FIG. 33C corresponds to FIG. 7E according to the first exemplary embodiment, and is different from FIG. 7E in operation of a clock signal CLK during a resetting period.

Figure 33D:
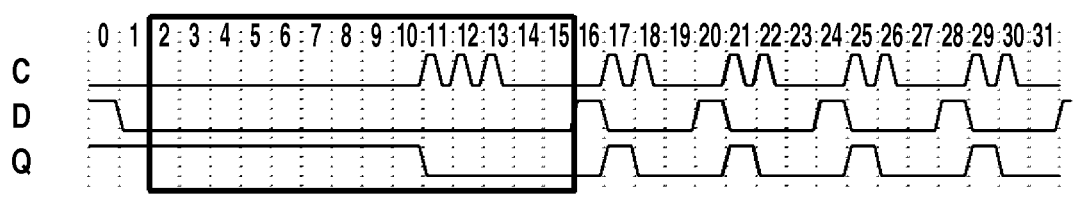

FIG. 33D is the timing chart illustrating the operation of the flip-flop 501 in the timing chart illustrated in FIG. 33C. A resetting period is a period from a cycle 2 to a cycle 15 enclosed by a heavy-line frame, and the flip-flop 501 is initialized at the cycle 11. A data signal DOUT output from an output data terminal Q of the flip-flop 501 is connected to the input data terminal D of the flip-flop 203. Thus, an initialization value of the previous flip-flop 501 is established after the cycles 2, 3, and 4 at which the flip-flop 203 with no reset is initialized. As described above, based on the clock input from the second conventional clock supply apparatus, when resetting periods of the plurality of circuit blocks are independent, complete resetting cannot be achieved (FIGS. 33A to 33D).

As described above, in the first clock supply apparatus according to the first exemplary embodiment, clocks for appropriately resetting the plurality of circuit blocks as a whole while reducing peak consumption current of the plurality of circuit blocks as a whole can be input to the plurality of circuit blocks. As a result, designing and manufacturing costs of a LSI power supply can be reduced.

Figure 14:
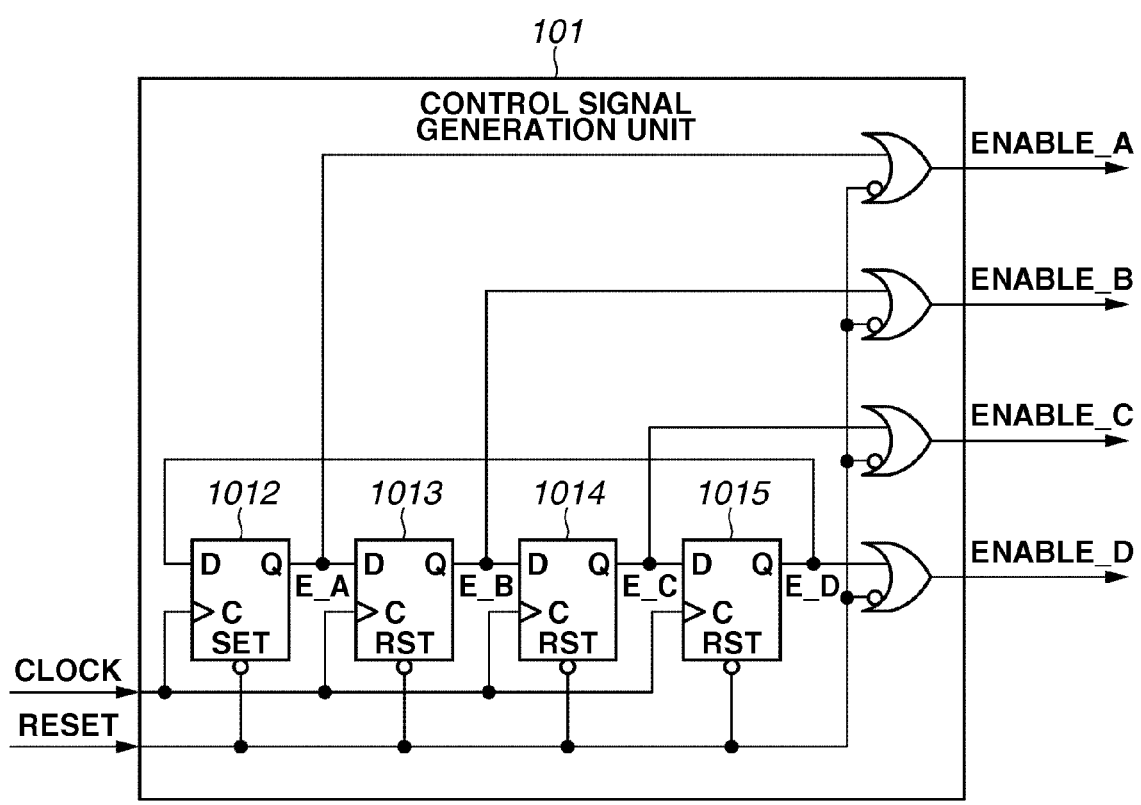
FIG. 14 is a block diagram illustrating an internal configuration of a control signal generation unit according to a second exemplary embodiment.

A configuration of a clock supply apparatus according to a second exemplary embodiment of the present invention is described with reference to the drawings. Only portions different from those of the first exemplary embodiment are described. In the clock supply apparatus according to the second exemplary embodiment, the control signal generation unit 101 of the clock supply apparatus according to the first exemplary embodiment is replaced by a control signal generation unit that has a different configuration illustrated in FIG. 14. FIG. 14 is a block diagram illustrating an internal configuration of the control signal generation unit 101 according to the second exemplary embodiment. In FIG. 14, the control signal generation unit 101 includes a flip-flop 1012 with the asynchronous set, and flip-flops 1013, 1014, and 1015 with the asynchronous reset. The flip-flop 1012 with the asynchronous set is connected to signal lines of a clock signal CLOCK, a reset signal RESET, an input signal E_D, and an output signal E_A. The flip-flop 1012 with the asynchronous set performs a data latching operation in synchronization with the clock signal, and an initialization operation asynchronously with the clock signal. The flip-flop 1012 with the asynchronous set receives the reset signal, and initializes a stored value at an H level (inactive level) while the reset signal is at an L level (during a normal operation). The flip-flop 1012 with the asynchronous set stores a value of the input signal E_D input to a data input terminal D in synchronization with the clock signal while the reset signal is at the H level, and outputs the signal as the output signal E_A from a data output terminal Q.

The flip-flop 1013 with the asynchronous reset is connected to signal lines of the clock signal CLOCK, the reset signal RESET, an input signal E_A, and an output signal E_B. The flip-flop 1013 with the asynchronous reset performs a data latching operation in synchronization with the clock signal, and an initialization operation asynchronously with the clock signal. The flip-flop 1013 with the asynchronous reset receives the reset signal, and initializes a stored value at an L level (inactive level) while the reset signal is at the L level (during a normal operation). The flip-flop 1013 with the asynchronous reset stores a value of the input signal E_A input to a data input terminal D in synchronization with the clock signal while the reset signal is at the H level, and outputs the signal as the output signal E_B from a data output terminal Q.

The flip-flop 1014 with the asynchronous reset is connected to signal lines of the clock signal CLOCK, the reset signal RESET, an input signal E_B, and an output signal E_C. The flip-flop 1014 with the asynchronous reset performs a data latching operation in synchronization with the clock signal, and an initialization operation asynchronously with the clock signal. The flip-flop 1014 with the asynchronous reset receives the reset signal, and initializes a stored value at an L level while the reset signal is at an L level. The flip-flop 1014 with the asynchronous reset stores a value of the input signal E_B input to a data input terminal D in synchronization with the clock signal while the reset signal is at the H level, and outputs the signal as the output signal E_C from a data output terminal Q.

The flip-flop 1015 with the asynchronous reset is connected to signal lines of the clock signal CLOCK, the reset signal RESET, an input signal E_C, and an output signal E_D. The flip-flop 1015 with the asynchronous reset performs a data latching operation in synchronization with the clock signal, and an initialization operation asynchronously with the clock signal. The flip-flop 1015 with the asynchronous reset receives the reset signal, and initializes a stored value at an L level while the reset signal is at the L level. The flip-flop 1015 with the asynchronous reset stores a value of the input signal E_C input to a data input terminal D in synchronization with the clock signal while the reset signal is at the H level, and outputs the signal as the output signal E_D from a data output terminal Q.

An output signal ENABLE_A is at an H level when the reset signal is at the L level or when the output signal E_A is at the H level, and at an L level in other cases. An output signal ENABLE_B is at an H level when the reset signal is at the L level or when the output signal E_B is at the H level, and at an L level in other cases. An output signal ENABLE_ is at an H level when the reset signal is at the L level or when the output signal E_C is at the H level, and at an L level in other cases. An output signal ENABLE_D is at an H level when the reset signal is at the L level or when the output signal E_ is at the H level, and at an L level in other cases. In other words, the control signal generation unit 101 according to the second exemplary embodiment includes a circuit where the flip-flops 1012 to 1015 are annularly connected in series, and outputs output signals of the flip-flops 1012 to 1015 as ENABLE_A to D during the resetting operation.

Figure 15:
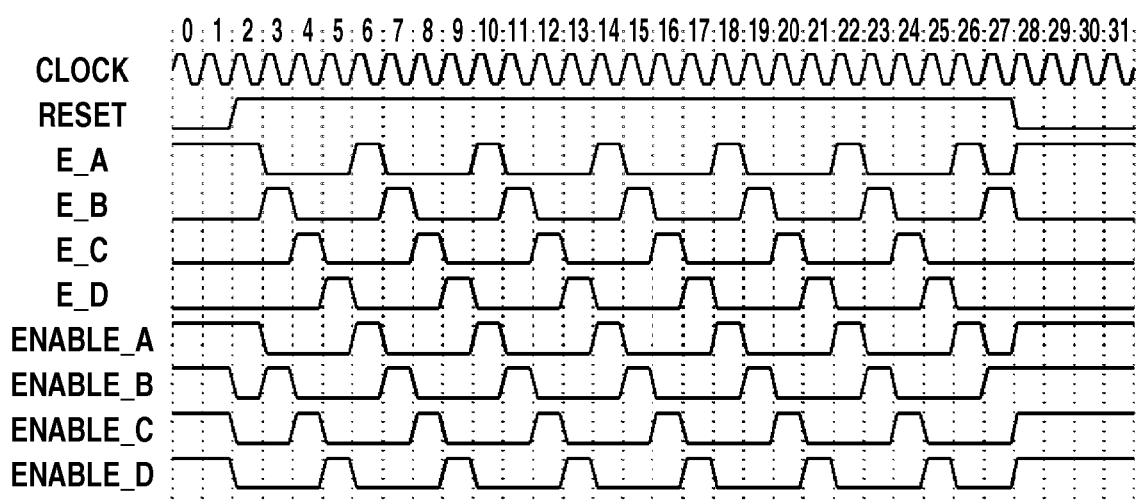
FIG. 15 is a timing chart illustrating an operation of the control signal generation unit according to the second exemplary embodiment.

A timing chart illustrating operations of the control signal generation unit 101, a clock gating cell 1021, and the clock supply apparatus 1 is a replacement, illustrated in FIG. 15, of the timing chart illustrated in FIG. 2A according to the first exemplary embodiment. In other words, the timing charts illustrated in FIGS. 2A and 2B are identical to those of the first exemplary embodiment.

FIG. 15 is a timing chart illustrating the operation of the control signal generation unit 101 according to the second exemplary embodiment. During the resetting period, i.e., while the reset signal RESET is a the H level, the output signals E_A, E_B, E_C, and E_D are transmitted by operations of the four flip-flops 1012, 1013, 1014, and 1015.

The control signal generation unit 101 operates by switching the output signals ENABLE_A, ENABLE_B, ENABLE_C, and ENABLE_D between the H level and the L level according to levels of the output signals E_A, E_B, E_C, and E_D during the resetting period as described above.

The output signals ENABLE_A, ENABLE_B, ENABLE_C, and ENABLE_D are fixed at H levels during a normal operation period, i.e., while the reset signal RESET is at the L level, as described above.

During the resetting period, i.e., while the resetting signal RESET is at the H level, the control signal generation unit 101 operates to prevent overlapping of clock cycles at which the output signals ENABLE_A, ENABLE_B, ENABLE_C, and ENABLE_D are set to H levels. The output signals ENABLE_A, ENABLE_B, ENABLE_C, and ENABLE_D are similar in waveform to that of FIG. 2A according to the first exemplary embodiment.

As described above, according to the second exemplary embodiment, the clock supply apparatus 1 of the present invention can be configured by the circuits that use clock gating by an enable signal generated by the flip-flops connected in series during the resetting period. According to the clock supply apparatus 1, a plurality of circuit blocks including the flip-flops with no resets can all be reset surely (cycle 6 illustrated in FIG. 5F). A maximum consumption current value during the resetting operation can be set smaller than that during the normal operation (FIGS. 13A to 13C).

According to the clock supply apparatus of the second exemplary embodiment, clocks for appropriately resetting the plurality of circuit blocks as a whole while reducing peak consumption current of the plurality of circuit blocks as a whole can be input to the plurality of circuit blocks. As a result, designing and manufacturing costs of a LSI power supply can be reduced.

A configuration of a clock supply apparatus according to a third exemplary embodiment of the present invention is described with reference to the drawings. Only portions different from those of the first exemplary embodiment are described. In the clock supply apparatus according to the third exemplary embodiment, the internal configuration of the clock supply apparatus according to the first exemplary embodiment is replaced by another configuration illustrated in FIG. 16.

Figure 16:
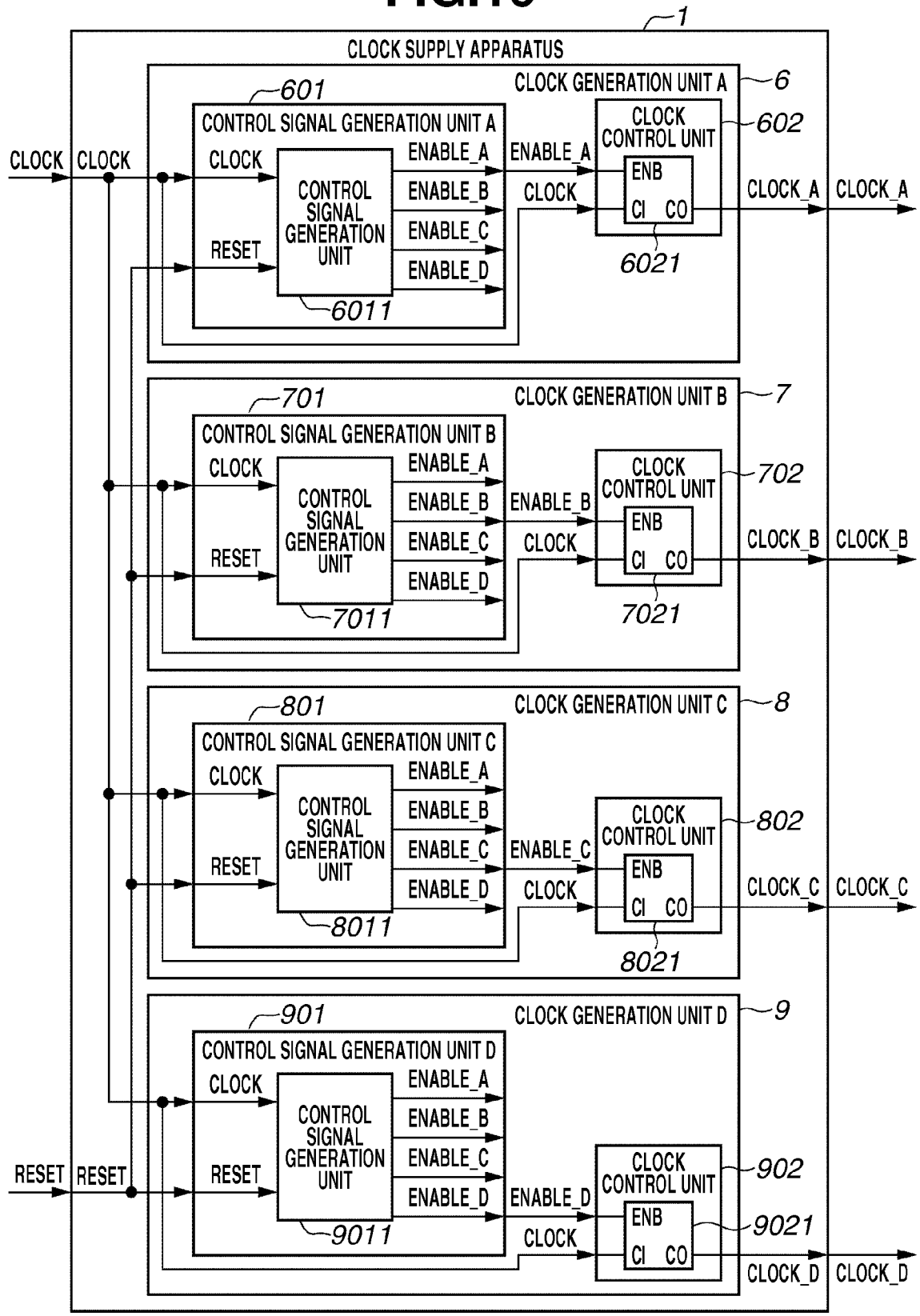
FIG. 16 is a block diagram illustrating an internal configuration of a clock supply apparatus according to a third exemplary embodiment of the present invention.

FIG. 16 is a block diagram illustrating an internal configuration of the control supply apparatus 1 according to the third exemplary embodiment. In FIG. 16, the clock supply apparatus 1 includes a clock generation unit A 6, a clock generation unit B 7, a clock generation unit C 8, and a clock generation unit D 9. The clock generation unit A 6 includes a control signal generation unit A 601 and a clock control unit 602. The clock generation unit B 7 includes a control signal generation unit B 701 and a clock control unit 702. The clock generation unit C 8 includes a control signal generation unit C 801 and a clock control unit 802. The clock generation unit D 9 includes a control signal generation unit D 901 and a clock control unit 902.

Control signal generation units 6011, 7011, 8011, and 9011 are similar to the control signal generation unit 101 according to the first exemplary embodiment. A clock gating cell 6021 is similar to the clock gating cell 1021 according to the first exemplary embodiment.

The clock supply apparatus 1 according to the third exemplary embodiment includes the four clock generation units (clock generation unit A 6, clock generation unit B 7, clock generation unit C 8, and clock generation unit D 9). These four clock generation units independently generate clock signals, and control an internal operation in synchronization with a common reset signal RESET.

The clock generation unit A 6 is connected to signal lines of a clock signal CLOCK, a reset signal RESET, and an output signal CLOCK_A, and operates in synchronization with the clock signal. The clock generation unit A 6 receives the reset signal, and operates by recognizing a normal operation period while the reset signal is at an L level, or a resetting period while the reset signal is at an H level. The clock generation unit A 6 outputs an output signal CLOCK_A.

The clock generation unit B 7 is connected to signal lines of the clock signal CLOCK, the reset signal RESET, and an output signal CLOCK_B, and operates in synchronization with the clock signal. The clock generation unit B 7 receives the reset signal, and operates by recognizing a normal operation period while the reset signal is at the L level, or a resetting period while the reset signal is at the H level. The clock generation unit B 7 outputs an output signal CLOCK_B.

The clock generation unit C 8 is connected to signal lines of the clock signal CLOCK, the reset signal RESET, and an output signal CLOCK_C, and operates in synchronization with the clock signal. The clock generation unit C 8 receives the reset signal, and operates by recognizing a normal operation period while the reset signal is at the L level, or a resetting period while the reset signal is at the H level. The clock generation unit C 8 outputs an output signal CLOCK_C.

The clock generation unit D 9 is connected to signal lines of the clock signal CLOCK, the reset signal RESET, and an output signal CLOCK_D, and operates in synchronization with the clock signal. The clock generation unit D 9 receives the reset signal, and operates by recognizing a normal operation period while the reset signal is at the L level, or a resetting period while the reset signal is at the H level. The clock generation unit D 9 outputs an output signal CLOCK_D.

The control signal generation unit A 601 is connected to the signal line of the clock signal CLOCK, the signal line of the reset signal RESET, and the clock control unit 602, and operates in synchronization with the clock signal. The control signal generation unit A 601 receives the reset signal, and operates by recognizing a normal operation period while the reset signal is at the L level, or a resetting period while the reset signal is at the H level. The control signal generation unit A 601 transmits a control signal ENABLE_A to the clock control unit 602.

The clock control unit 602 is connected to the signal line of the clock signal CLOCK, the control signal generation unit A 601, and the signal line of the output clock signal CLOCK_A. The clock control unit 602 operates by using the clock signal. The clock control unit 602 outputs an output clock signal CLOCK_A according to the control signal ENABLE_A output from the control signal generation unit A 601.

The control signal generation unit B 701 is connected to the signal line of the clock signal CLOCK, the signal line of the reset signal RESET, and the clock control unit 702, and operates in synchronization with the clock signal. The control signal generation unit B 701 receives the reset signal, and operates by recognizing a normal operation period while the reset signal is at the L level, or a resetting period while the reset signal is at the H level. The control signal generation unit B 701 transmits a control signal ENALBE_B to the clock control unit 702.

The clock control unit 702 is connected to the signal line of the clock signal CLOCK, the control signal generation unit B 701, and the signal line of the output clock signal CLOCK_B. The clock control unit 702 operates by using the clock signal. The clock control unit 702 outputs an output clock signal CLOCK_B according to the control signal ENABLE_B output from the control signal generation unit B 701.

The control signal generation unit C 801 is connected to the signal line of the clock signal CLOCK, the signal line of the reset signal RESET, and the clock control unit 802, and operates in synchronization with the clock signal. The control signal generation unit C 801 receives the reset signal, and operates by recognizing a normal operation period while the reset signal is at the L level, or a resetting period while the reset signal is at the H level. The control signal generation unit C 801 transmits a control signal ENABLE_C to the clock control unit 802.

The clock control unit 802 is connected to the signal line of the clock signal CLOCK, the control signal generation unit C 801, and the signal line of the output clock signal CLOCK_C. The clock control unit 802 operates by using the clock signal. The clock control unit 802 outputs an output clock signal CLOCK_C according to the control signal ENABLE_C output from the control signal generation unit C 801.

The control signal generation unit D 901 is connected to the signal line of the clock signal CLOCK, the signal line of the reset signal RESET, and the clock control unit 902, and operates in synchronization with the clock signal. The control signal generation unit D 901 receives the reset signal, and operates by recognizing a normal operation period while the reset signal is at the L level, or a resetting period while the reset signal is at the H level. The control signal generation unit D 901 transmits a control signal ENABLE_D to the clock control unit 902.

The clock control unit 902 is connected to the signal line of the clock signal CLOCK, the control signal generation unit D 901, and the signal line of the output clock signal CLOCK_D. The clock control unit 902 operates by using the clock signal. The clock control unit 902 outputs an output clock signal CLOCK_D according to the control signal ENABLE_D output from the control signal generation unit D 901.

The control signal generation unit 6011 is connected to the signal lines of the clock signal CLOCK, the reset signal RESET, and the output signal ENABLE_A, and operates in synchronization with the clock signal. The control signal generation unit 6011 receives the reset signal, and operates by recognizing a normal operation period while the reset signal is at the L level, or a resetting period while the reset signal is at the H level. The control signal generation unit 6011 transmits a control signal ENABLE_A to an output signal line ENABLE_A.

The control signal generation unit 7011 is connected to the signal lines of the clock signal CLOCK, the reset signal RESET, and the output signal ENABLE_B, and operates in synchronization with the clock signal. The control signal generation unit 7011 receives the reset signal, and operates by recognizing a normal operation period while the reset signal is at the L level, or a resetting period while the reset signal is at the H level. The control signal generation unit 7011 transmits a control signal ENABLE_B to an output signal line ENABLE_B.

The control signal generation unit 8011 is connected to the clock signal CLOCK, the reset signal RESET, and the output signal ENABLE_C, and operates in synchronization with the clock signal. The control signal generation unit 8011 receives the reset signal, and operates by recognizing a normal operation period while the reset signal is at the L level, or a resetting period while the reset signal is at the H level. The control signal generation unit 8011 transmits a control signal ENABLE_C to an output signal line ENABLE_C.

The control signal generation unit 9011 is connected to the clock signal CLOCK, the reset signal RESET, and the output signal ENABLE_D, and operates in synchronization with the clock signal. The control signal generation unit 9011 receives the reset signal, and operates by recognizing a normal operation period while the reset signal is at the L level, or a resetting period while the reset signal is at the H level. The control signal generation unit 9011 transmits a control signal ENABLE_D to an output signal line ENABLE_D.

The clock gating cell 6021 is connected to the signal lines of the clock signal CLOCK, the input signal ENABLE_A, and the output clock signal CLOCK_A at CI, ENB, and CO terminals. The clock gating cell 7021 is connected to the signal lines of the clock signal CLOCK, the input signal ENABLE_B, and the output clock signal CLOCK_B at CI, ENB, and CO terminals. The clock gating cell 8021 is connected to the signal lines of the clock signal CLOCK, the input signal ENABLE_C, and the output clock signal CLOCK_C at CI, ENB, and CO terminals. The clock gating cell 9021 is connected to the signal lines of the clock signal CLOCK, the input signal ENABLE_B, and the output clock signal CLOCK_D at CI, ENB, and CO terminals.

The clock gating cell 6021 thins clock pulses contained in the clock signal CLOCK according to an input signal ENB to output the signal as an output signal CO. The clock control unit 702, the clock control unit 802, and the clock control unit 902 are similar to the clock control unit 602.

Other components are similar to those of the first exemplary embodiment. That is, the clock signals CLOCK_A, CLOCK_B, CLOCK_C, and CLOCK_D input from the clock supply apparatus 1 according to the third exemplary embodiment to the clock signals CLOCK_A, CLOCK_B, CLOCK_C, and CLOCK_D are similar in waveform to those of the first exemplary embodiment illustrated in FIG. 2C.

As described above, according to the third exemplary embodiment, the clock supply apparatus 1 of the present invention can be configured by the plurality of circuits that use clock gating by an enable signal generated based on counter values during the resetting period. According to the clock supply apparatus 1 of the third exemplary embodiment, a plurality of circuit blocks including the flip-flops with no resets can all be reset surely (cycle 6 illustrated in FIG. 5F). A maximum consumption current value during the resetting operation can be set smaller than that during the normal operation (FIGS. 13A to 13C).

According to the clock supply apparatus of the third exemplary embodiment, clocks for appropriately resetting the plurality of circuit blocks as a whole while reducing peak consumption current of the plurality of circuit blocks as a whole can be input to the plurality of circuit blocks. As a result, designing and manufacturing costs of a LSI power supply can be reduced.

Figure 17:
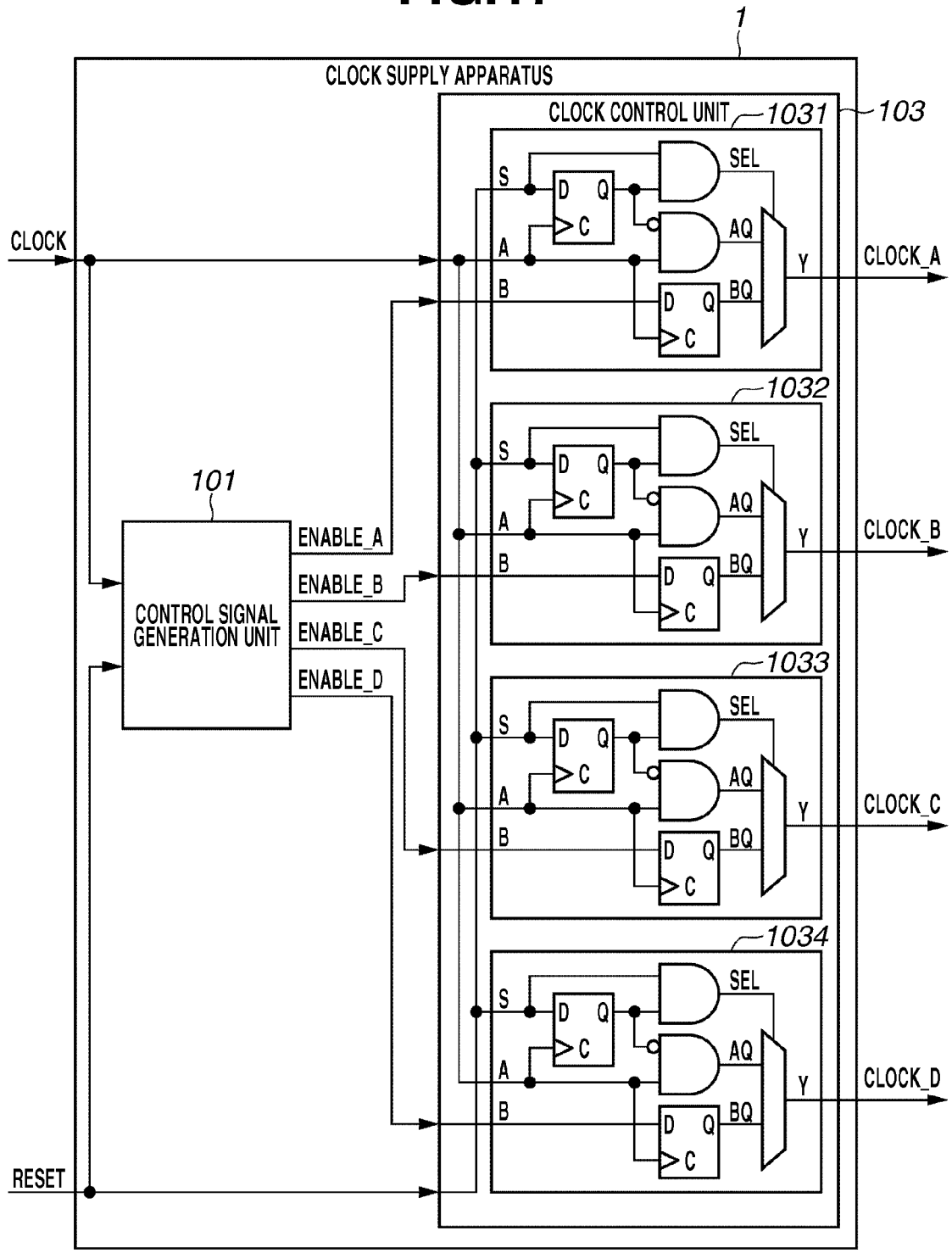
FIG. 17 is a block diagram illustrating an internal configuration of a clock supply apparatus according to a fourth exemplary embodiment of the present invention.

A configuration of a clock supply apparatus according to a fourth exemplary embodiment of the present invention is described with reference to the drawings. Only portions different from those of the first exemplary embodiment are described. In the clock supply apparatus according to the forth exemplary embodiment, the clock control unit 102 of the clock supply apparatus according to the first exemplary embodiment is replaced by a clock control unit 103 having another configuration illustrated in FIG. 17. FIG. 17 is a block diagram illustrating an internal configuration of the control supply apparatus 1 according to the fourth exemplary embodiment. A clock signal generation unit 101 is similar to the control signal generation unit 101 (FIG. 1) according to the first exemplary embodiment, or to the control signal generation unit 101 (FIG. 14) according to the second exemplary embodiment. The clock supply apparatus 1 according to the fourth exemplary embodiment includes the clock control unit 103, and selectors 1031, 1032, 1033, and 1034.

The control signal generation unit 101 is connected to a signal line of a clock signal CLOCK, a signal line of a reset signal RESET, and the clock control unit 103, and operates in synchronization with the clock signal. The control signal generation unit 101 receives the reset signal, and operates by recognizing a normal operation period while the reset signal is at an L level, or a resetting period while the reset signal is at an H level. The control signal generation unit 101 transmits a plurality of control signals ENABLE_A, ENABLE_B, ENABLE_C, and ENABLE_D to the clock control unit 103.

The clock control unit 103 is connected to the signal line of the clock signal CLOCK, the signal line of the reset signal RESET, the control signal generation unit 101, and signal lines of output clock signals CLOCK_A, CLOCK_B, CLOCK_C, and CLOCK_D. The clock control unit 103 operates by using the clock signal. The clock control unit 103 receives the plurality of control signals ENABLE_A, ENABLE_B, ENABLE_C, and ENABLE_D output from the control signal generation unit 101. The clock control unit 103 outputs output clock signals CLOCK_A, CLOCK_B, CLOCK_C, and CLOCK_D according to the reset signal RESET and the plurality of control signals ENABLE_A, ENABLE_B, ENABLE_C, and ENABLE_D.

The selector 1031 is connected to signal lines of the clock signal CLOCK, the input signal ENABLE_A, the reset signal RESET, and the output clock signal CLOCK_A at A, B, S, and Y terminals. The selector 1031 outputs the clock signal CLOCK while the reset signal is at an L level, and the input signal ENABLE_A while the reset signal RESET is at an H level to the signal line of the output clock signal CLOCK_A.

The selector 1032 is connected to the signal lines of the clock signal CLOCK, the input signal ENABLE_A, the reset signal RESET, and the output clock signal CLOCK_B at the A, B, S, and Y terminals. The selector 1031 outputs the clock signal CLOCK while the reset signal is at the L level, and the input signal ENABLE_B while the reset signal RESET is at the H level to the signal line of the output clock signal CLOCK_B.

The selector 1033 is connected to the signal lines of the clock signal CLOCK, the input signal ENABLE_C, the reset signal RESET, and the output clock signal CLOCK_C at the A, B, S, and Y terminals. The selector 1031 outputs the clock signal CLOCK while the reset signal is at the L level, and the input signal ENABLE_C while the reset signal RESET is at the H level to the signal line of the output clock signal CLOCK_C.

The selector 1034 is connected to the signal lines of the clock signal CLOCK, the input signal ENABLE_D, the reset signal RESET, and the output clock signal CLOCK_D at the A, B, S, and Y terminals. The selector 1034 outputs the clock signal CLOCK while the reset signal is at the L level, and the input signal ENABLE_D while the reset signal RESET is at the H level to the output clock signal CLOCK_D.

The selector 1031 operates by using an input signal A as a clock signal. The selector 1031 outputs an L level at a next cycle where a select signal S changes from an H level to an L level. The selector 1031 outputs, at other timing, a signal acquired by delaying the input signal A or B by one cycle according to a level of a signal where the select signal S is delayed by one cycle. The selectors 1032, 1033, and 1034 are similar to the selector 1031.

Figure 18A:
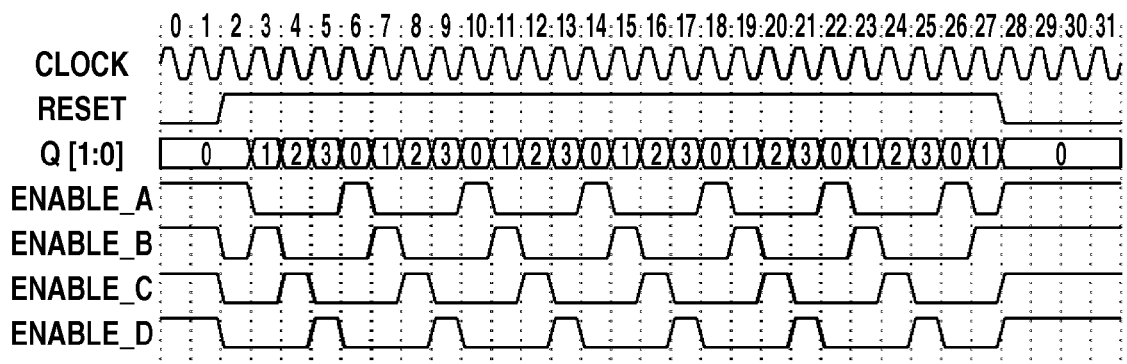
FIGS. 18A to 18C are timing charts illustrating operations of a control signal generation unit, a selector, and the clock supply apparatus according to the fourth exemplary embodiment.
Figure 18B:
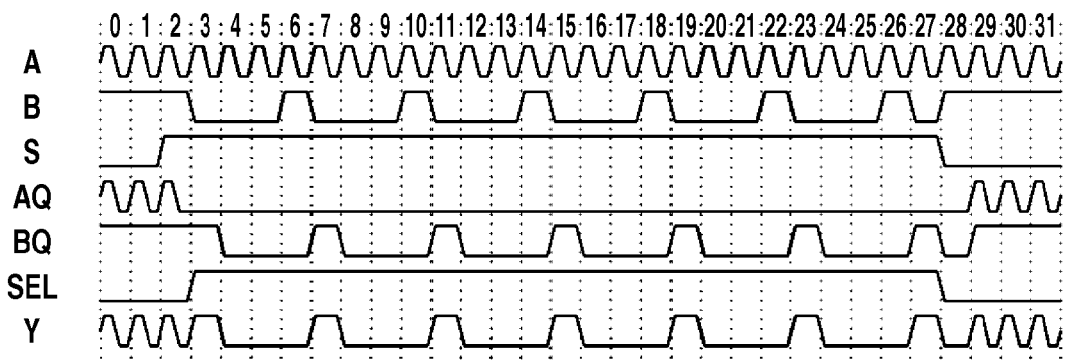
Figure 18C:
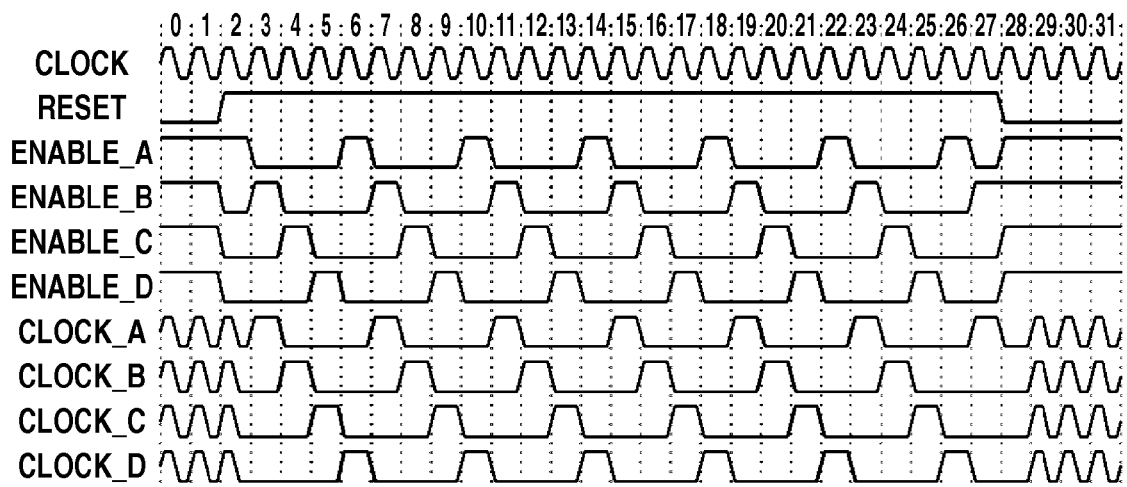

FIGS. 18A to 18C are timing charts illustrating operations of the control signal generation unit 101, the selector 1031, and the clock supply apparatus 1 according to the fourth exemplary embodiment. FIG. 18A is the timing chart illustrating the operation of the control signal generation unit 101 according to the fourth exemplary embodiment. FIG. 18A is similar to FIG. 2A of the first exemplary embodiment. FIG. 18B is the timing chart illustrating the operation of the selector 1031 according to the fourth exemplary embodiment. As described above, the selector 1031 sets a signal SEL to an L level at the next cycle where the select single S changes from the H level to the L level, sets the signal acquired by delaying the select signal S by one cycle as a signal SEL at other timing, and switches an output signal Y.

FIG. 18C is the timing chart illustrating the operation of the clock supply apparatus 1 according to the fourth exemplary embodiment. While the reset signal is at the H level, as described above, the plurality of control signals ENABLE_A, ENABLE_B, ENABLE_C, and ENABLE_D are generated not to be set to H levels simultaneously. The output clock signals CLOCK_A, CLOCK_B, CLOCK_C, and CLOCK_D are switched to the plurality of control signals during the resetting period.

Figure 19A:
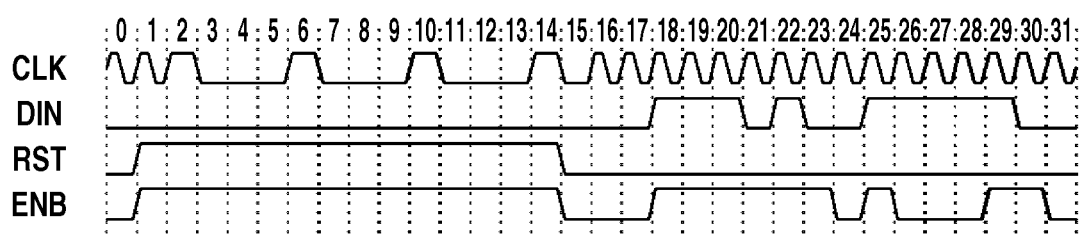
FIGS. 19A and 19B are timing charts illustrating operations of the peripheral circuit of the flip-flop, and the flip-flop illustrated in FIG. 4A based on a clock input from the clock supply apparatus according to the fourth exemplary embodiment.
Figure 19B:
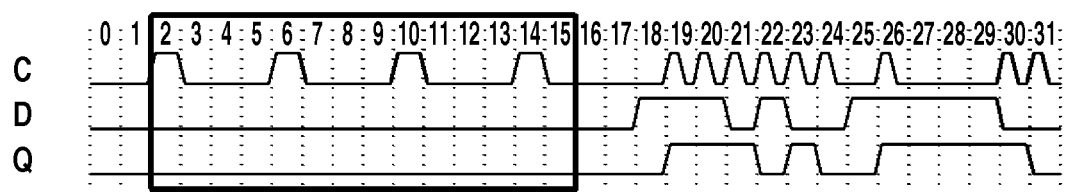

FIGS. 19A and 19B are timing charts illustrating operations of the peripheral circuit of the flip-flop 201, and the flip-flop 201 illustrated in FIG. 4A based on a clock input from the clock supply apparatus according to the fourth exemplary embodiment.

FIG. 19A is the timing chart illustrating the operation of the peripheral circuit of the flip-flop 201 illustrated in FIG. 4A based on the clock input from the clock supply apparatus according to the fourth exemplary embodiment. A control signal ENB for performing enabling control by the "clock gating technology based on enabling" is at an H level at timing when the flip-flop 201 is set in a state to perform a latching operation. The state to perform the latching operation is determined based on logical design contents, and the H-level period of the reset signal is included in the state to perform the latching operation. In the state to perform the latching operation, the control signal ENB takes a value of the H level.

A clock signal CLK becomes, as described above, a clock which is replaced by the control signal during the resetting period. Initialization of the flip-flop 201 by a reset signal RST is performed in synchronization with the clock as described above. Thus, the resetting period is a period from a cycle 2 to a cycle 15 where the H-level period of the reset signal is shifted backward by one clock cycle.

FIG. 19B is the timing chart illustrating the operation of the flip-flop 201 in the timing chart illustrated in FIG. 19A. A clock input to a clock terminal C is, as described above, a clock subjected to clock gating at the clock gating cell 2011 according to the control signal ENB based on the clock signal CLK input to the clock gating cell 2011. Thus, a clock input to the clock terminal C during the resetting period where the control signal ENB is always at the H level is the clock signal CLK. A clock input to the clock terminal C during the normal operation where the control signal ENB changes is a clock where clock pulses have been thinned as illustrated.

The resetting period is a period from a cycle 2 to a cycle 15 enclosed by a heavy-line frame illustrated in FIG. 19B. The flip-flop 201 is initialized at the cycle 2. However, a stored value is not changed.

FIG. 20 illustrates the operation and a magnitude of consumption current of the flip-flop 201 in the timing chart illustrated in FIG. 19B. FIG. 20 is similar to FIG. 6A of the first exemplary embodiment, and the illustrated magnitude of the consumption current is similar to that illustrated in FIG. 6A.

Timing charts, operations, and magnitudes of consumption currents of the flip-flops 202, 203, 301, 401, and 501 are, while not illustrated, similar to those of the first exemplary embodiment. Other components are similar to those of the first exemplary embodiment.

As described above, according to the fourth exemplary embodiment, the clock supply apparatus 1 of the present invention can be configured by the circuit that switches a signal generated based on a counter value during the resetting period to output the signal. According to the clock supply apparatus 1 of the fourth exemplary embodiment, a plurality of circuit blocks including the flip-flops with no resets can all be reset surely. A maximum consumption current value during the resetting operation can be set smaller than that during the normal operation (FIGS. 13A to 13C).

According to the clock supply apparatus of the fourth exemplary embodiment, clocks for appropriately resetting the plurality of circuit blocks as a whole while reducing peak consumption current of the plurality of circuit blocks as a whole can be input to the plurality of circuit blocks. As a result, designing and manufacturing costs of a LSI power supply can be reduced.

A configuration of a clock supply apparatus according to a fifth exemplary embodiment of the present invention is described with reference to the drawings. Only portions different from those of the fourth exemplary embodiment are described. In the clock supply apparatus according to the fifth exemplary embodiment, the control signal generation unit 101 of the clock supply apparatus according to the fourth exemplary embodiment illustrated in FIG. 17 is replaced by a control signal generation unit 103 that has a different configuration illustrated in FIG. 21.

Figure 21:
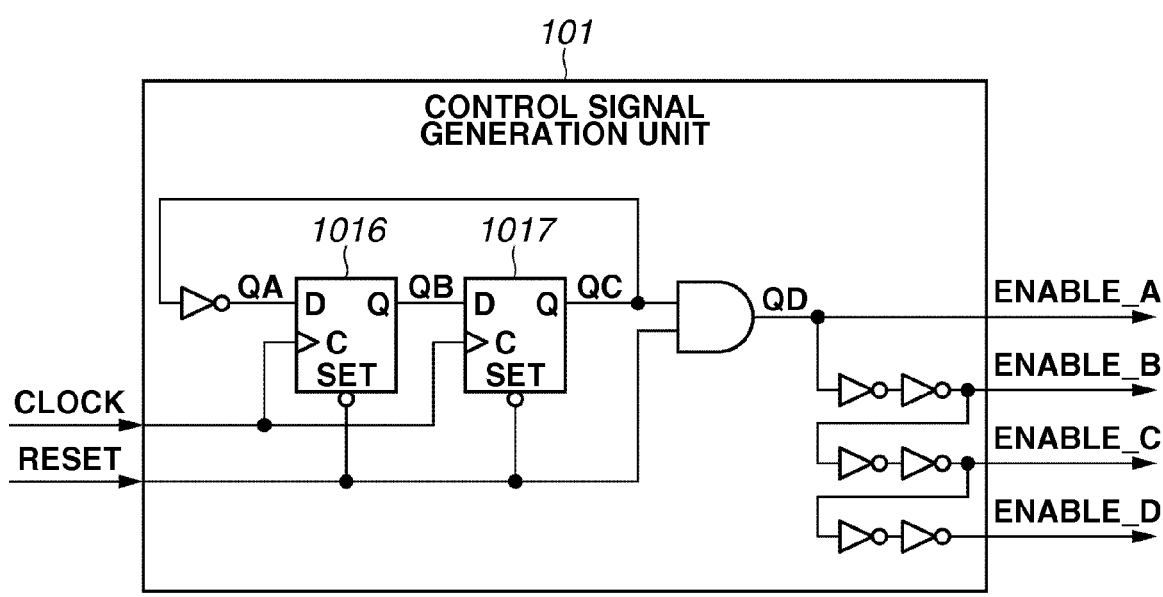
FIG. 21 is a block diagram illustrating an internal configuration of a control signal generation unit according to a fifth exemplary embodiment of the present invention.

FIG. 21 is a block diagram illustrating an internal configuration of the control signal generation unit 101 according to the fifth exemplary embodiment. In FIG. 21, the control signal generation unit 101 includes flip-flops 1016 and 1017 with asynchronous sets. The flip-flop 1016 with the asynchronous set is connected to signal lines of a clock signal CLOCK, a reset signal RESET, an input signal QA, and an output signal QB. The flip-flop 1016 with the asynchronous set performs a data latching operation in synchronization with the clock signal, and an initialization operation asynchronously with the clock signal. The flip-flop 1016 with the asynchronous set receives the reset signal, and initializes a stored value at an H level while the reset signal is at an L level. The flip-flop 1016 with the asynchronous set stores a value of the input signal QA input to a data input terminal D in synchronization with the clock signal while the reset signal is at the H level, and outputs the signal as the output signal QB from a data output terminal Q.

The flip-flop 1017 with the asynchronous set is connected to the signal lines of the clock signal CLOCK, the reset signal RESET, the input signal QB, and an output signal QC. The flip-flop 1017 with the asynchronous set performs a data latching operation in synchronization with the clock signal, and an initialization operation asynchronously with the clock signal. The flip-flop 1017 with the asynchronous set receives the reset signal, and initializes a stored value at an H level while the reset signal is at the L level. The flip-flop 1017 with the asynchronous set stores a value of the input signal QB input to the data input terminal D in synchronization with the clock signal while the reset signal is at the H level, and outputs the signal as the output signal QC from the data output terminal Q.

A value of the signal QA is acquired by logically reversing a value of the signal QC by an illustrated inverter, which becomes a signal delayed by a delay amount of the inverter. A value of a signal QD is a logical product of the value of the signal QC and the value of the reset signal RESET. In other words, during the resetting period, the signal QD becomes a ¼ frequency-divided signal acquired by dividing the clock signal CLOCK by 4.

An output signal ENABLE_A becomes a signal that has the value of the signal QD. An output signal ENABLE_B becomes a signal acquired by logically reversing the value of the signal QD twice by the illustrated inverter, which is delayed by a delay amount of two inverters. An output signal ENABLE_C becomes a signal acquired by logically reversing the value of the signal QD four times by the illustrated inverter, which is delayed by a delay amount of four inverters. An output signal ENABLE_D becomes a signal acquired by logically reversing the value of the signal QD six times by the illustrated inverter, which is delayed by a delay amount of six inverters.

Figure 22A:
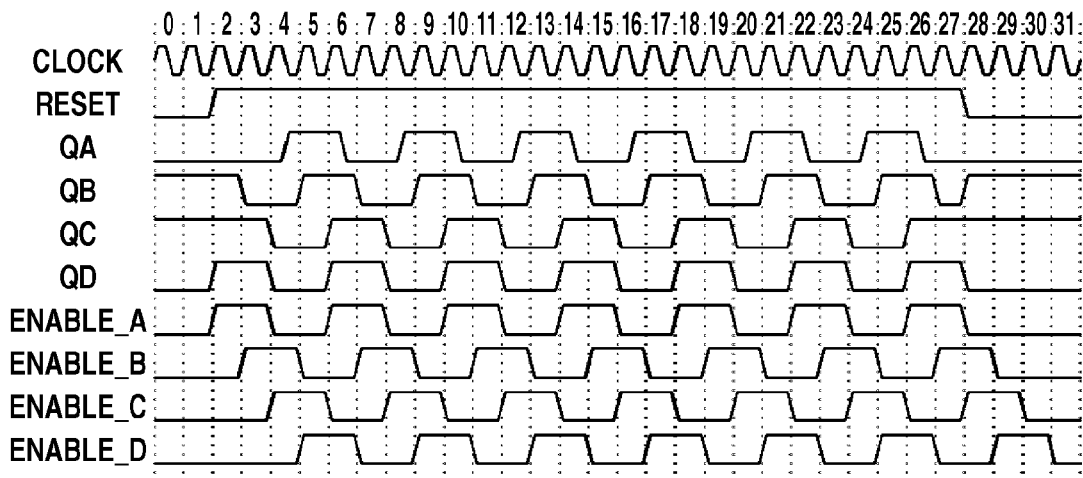
FIGS. 22A to 22C are timing charts illustrating operations of the control signal generation unit, a selector, and a clock supply apparatus according to the fifth exemplary embodiment.
Figure 22B:
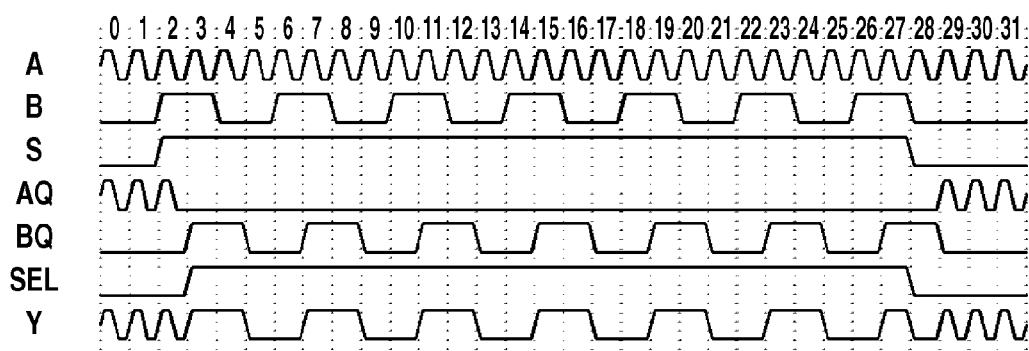
Figure 22C:
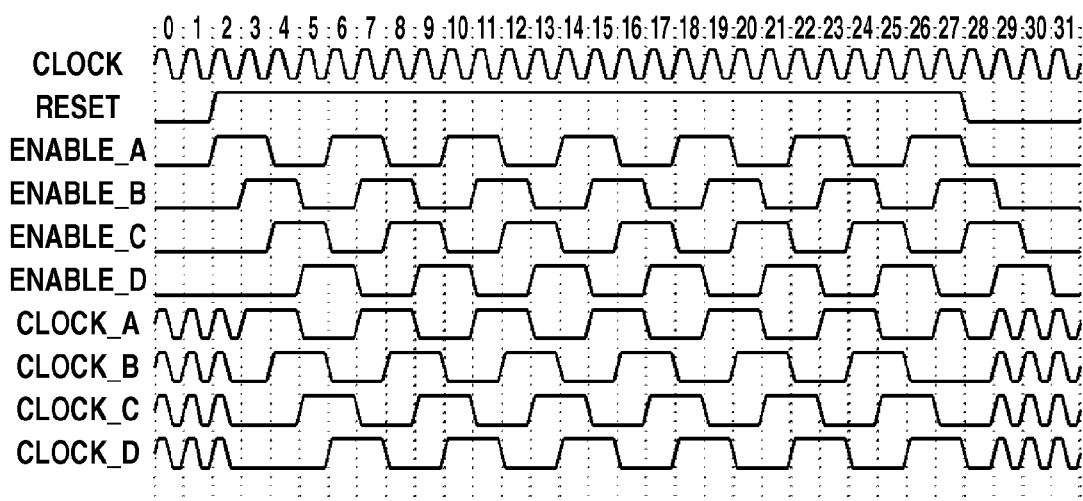

FIGS. 22A to 22C are timing charts illustrating operations of the control signal generation unit 101, a selector 1031, and the clock supply apparatus 1 according to the fifth exemplary embodiment. FIG. 22A is the timing chart illustrating the operation of the control signal generation unit 101 according to the fifth embodiment. Output signals ENABLE_A, ENABLE_B, ENABLE_C, and ENABLE_D are, as described above, generated based on the signal QD. During a normal operation, i.e., while the reset signal RESET is at the L level, the output signal ENABLE_A is set to an L level. The output signals ENABLE_B, ENABLE_C, and ENABLE_D are signals acquired by delaying the output signal ENABLE_A by 1, 2, and 3 cycles.

During the resetting period, i.e., while the reset signal RESET is at the H level, the control signal generation unit 101 operates to prevent overlapping of rising edges of the output signals ENABLE_A, ENABLE_B, ENABLE_C, and ENABLE_D. In other words, during the resetting period, the output signals ENABLE_A, ENABLE_B, ENABLE_C, and ENABLE_D have different active edge phases.

FIG. 22B is the timing chart illustrating the operation of the selector 1031 according to the fifth exemplary embodiment. As described above, the selector 1031 sets a signal SEL to an L level at a next cycle where a select single S changes from an H level to an L level, sets a signal acquired by delaying the select signal S by one cycle as a signal SEL at other timing, and switches an output signal Y.

FIG. 22C is the timing chart illustrating the operation of the clock supply apparatus 1 according to the fifth exemplary embodiment. While the reset signal is at the H level, as described above, a plurality of control signals ENABLE_A, ENABLE_B, ENABLE_C, and ENABLE_D are generated not to be overlapped for rising edges. Output clock signals CLOCK_A, CLOCK_B, CLOCK_C, and CLOCK_D are switched to the plurality of control signals ENABLE_A, ENABLE_B, ENABLE_C, and ENABLE_D during the resetting period. In other words, during the resetting period, the clock supply apparatus 1 according to the fifth exemplary embodiment delays frequency-divided signals QD acquired by frequency-dividing the clock signal CLOCK at different time periods to generate output signals ENABLE_A to D, and outputs the signals as a plurality of clock signals CLOCK_A to D.

Figure 23A:
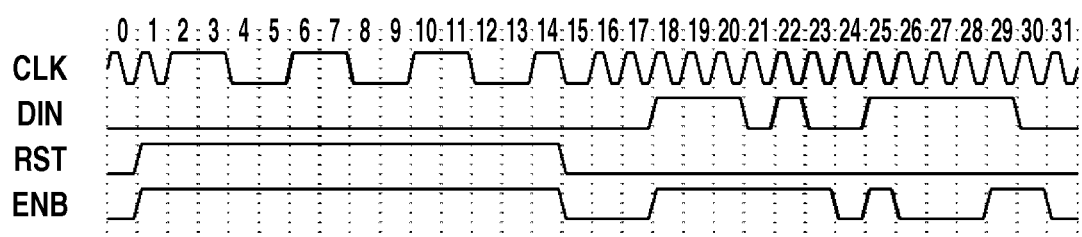
FIGS. 23A and 23B are timing charts illustrating operations of the peripheral circuit of the flip-flop, and the flip-flop illustrated in FIG. 4A based on a clock input from the clock supply apparatus according to the fifth exemplary embodiment.
Figure 23B:
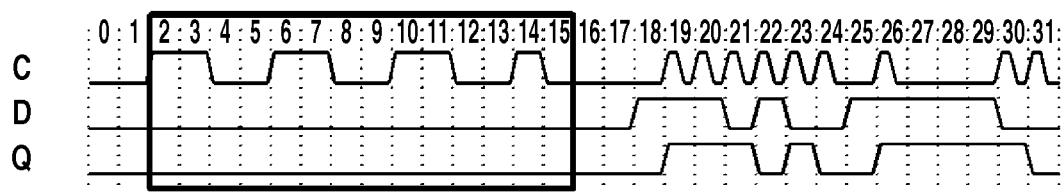

FIGS. 23A and 23B are timing charts illustrating operations of the peripheral circuit of the flip-flop 201, and the flip-flop 201 illustrated in FIG. 4A based on a clock input from the clock supply apparatus according to the fifth exemplary embodiment.

FIG. 23A is the timing chart illustrating the operation of the circuit illustrated in FIG. 4A based on the clock input from the clock supply apparatus according to the fifth exemplary embodiment. A control signal ENB for performing enabling control by the "clock gating technology based on enabling" is at an H level at timing when the flip-flop 201 is set in a state to perform a latching operation. The state to perform the latching operation is determined based on logical design contents, and the H-level period of the reset signal is included in the state to perform the latching operation. In the state to perform the latching operation, the control signal ENB takes a value of the H level.

A clock signal CLK becomes, as described above, a clock which is replaced by the control signal during the resetting period. Initialization of the flip-flop 201 by a reset signal RST is performed in synchronization with the clock as described above. Thus, the resetting period is a period from a cycle 2 to a cycle 15 where the H-level period of the reset signal is shifted backward by one clock cycle.

FIG. 23B is the timing chart illustrating the operation of the flip-flop 201 in the timing chart illustrated in FIG. 23A. A clock input to a clock terminal C is, as described above, a clock subjected to clock gating at the clock gating cell 2011 according to the control signal ENB based on the clock signal CLK input to the clock gating cell 2011. Thus, a clock input to the clock terminal C during the resetting period where the control signal ENB is always at the H level is the clock signal CLK. A clock input to the clock terminal C during the normal operation where the control signal ENB changes is a clock having clock pulses thinned as illustrated.

The resetting period is a period from a cycle 2 to a cycle 15 enclosed by a heavy-line frame illustrated in FIG. 23B. The flip-flop 201 is initialized at the cycle 2. However, a stored value is not changed.

FIG. 24 illustrates the operation and a magnitude of consumption current of the flip-flop 201 in the timing chart illustrated in FIG. 23B. FIG. 24 is similar to FIG. 6A of the first exemplary embodiment, and the illustrated magnitude of the consumption current is similar to that illustrated in FIG. 6A.

Timing charts, operations, and magnitudes of consumption currents of the flip-flops 202, 203, 301, 401, and 501 are, while not illustrated, similar to those of the first exemplary embodiment. Other components are similar to those of the first exemplary embodiment.

As described above, according to the fifth exemplary embodiment, the clock supply apparatus 1 of the present exemplary embodiment can be configured by the circuit that switches signals generated by a delay circuit and a reversing circuit to clock signals during the resetting period to output the signals. According to the clock supply apparatus 1, a plurality of circuit blocks including the flip-flops with no resets can all be reset surely. A maximum consumption current value during the resetting operation can be set smaller than that during the normal operation (FIGS. 13A to 13C).

According to the clock supply apparatus of the fifth exemplary embodiment, clocks for appropriately resetting the plurality of circuit blocks as a whole while reducing peak consumption current of the plurality of circuit blocks as a whole can be input to the plurality of circuit blocks. As a result, designing and manufacturing costs of a LSI power supply can be reduced.

The structures and contents of various data are not limited to the above. Needless to say, various structures and contents can be employed according to use and purposes. The present invention is not limited to the exemplary embodiments. Various changes (including organic combinations of the exemplary embodiments) can be made based on a spirit and a scope of the invention. In other words, combinations of the exemplary embodiments and modified examples thereof are within the present invention.

As described above, the clock supply apparatus according to the present exemplary embodiment can input clocks for appropriately resetting the plurality of circuit blocks as a whole, and reducing a maximum consumption current value during the resetting operation to be lower than that during the normal operation. Thus, by reducing the maximum consumption current value during the normal operation, designing and manufacturing costs of a LSI power supply can be reduced.

According to an exemplary embodiment the present invention, a plurality of circuit blocks can be appropriately reset while peak consumption current of the plurality of circuit blocks is reduced as a whole.

Aspects of the present invention can also be realized by a computer of a system or apparatus (or devices such as a central processing unit (CPU), micro-processing unit (MPU), and/or the like) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., a computer-readable medium).

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. A clock supply apparatus for supplying clock signals to a first circuit block and a second circuit block, the clock supply apparatus comprising:
   each of a first control signal generation unit and a second control signal generation unit configured to supply a first control signal and a second control signal;
   a first clock control unit configured to input the first control signal supplied by the first control signal generation unit and to supply a first clock signal having an active edge phase, to reset the first circuit block, to the first circuit block in response to the first control signal; and
   a second clock control unit configured to input the second control signal supplied by the second control signal generation unit and to supply a second clock signal having an active edge phase different from the active edge phase of the first clock signal, to reset the second circuit block, to the second circuit block in response to the second control signal.

2. The clock supply apparatus according to claim 1, wherein the active edge phase of the first clock signal supplied by the first clock control unit and the active edge phase of the second clock signal supplied by the second clock control unit are supplied to the first circuit block and the second circuit block, respectively, at different timings.

3. The clock supply apparatus according to claim 1, wherein the first clock control unit is configured to generate, by thinning clock pulses of an inactive period of the first control signal from a predetermined clock signal, the first clock signal, and the second clock control unit is configured to generate, by thinning clock pulses of an inactive period of the second control signal from the predetermined clock signal, the second clock signal.

4. The clock supply apparatus according to claim 1, wherein each of the first control signal generation unit and the second control signal generation unit is configured to generate, by thinning clock pulses of different periods from a predetermined clock signal, the first control signal and the second control signal.

5. The clock supply apparatus according to claim 4, wherein each of the first control signal generation unit and the second control signal generation unit includes a counter configured to count clock pulses of the predetermined clock signal during a resetting operation, and a circuit configured to generate the first control signal and the second control signal that become active during periods corresponding to different values indicated by the counter during the resetting operation.

6. The clock supply apparatus according to claim 5, wherein each of the first control signal generation unit and the second control signal generation unit includes a circuit having a plurality of flip-flops annularly connected in series, the plurality of flip-flops being operated in synchronization with the predetermined clock signal and including a flip-flop initialized to an active level according to a reversal signal of a resetting signal for resetting the plurality of circuit blocks and a flip-flop initialized to an inactive level according to the reversal signal of the resetting signal, and outputs output signals of the plurality of flip-flops as the plurality of control signals when the reset signal is at an active level.

* * * * *